(12) United States Patent
Nishikawa

(10) Patent No.: US 10,595,406 B2
(45) Date of Patent: Mar. 17, 2020

(54) MODULE COMPONENT

(71) Applicant: Murata Manufacturing Co., Ltd., Nagaokakyo-shi, Kyoto-fu (JP)

(72) Inventor: Hiroshi Nishikawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 3 days.

(21) Appl. No.: 16/180,055

(22) Filed: Nov. 5, 2018

(65) Prior Publication Data

US 2019/0075654 A1    Mar. 7, 2019

Related U.S. Application Data

(63) Continuation of application No. PCT/JP2017/014160, filed on Apr. 4, 2017.

(30) Foreign Application Priority Data

May 18, 2016    (JP) .................................. 2016-099998

(51) Int. Cl.
| | |
|---|---|
| H05K 1/18 | (2006.01) |
| H05K 1/11 | (2006.01) |
| H05K 1/02 | (2006.01) |
| H05K 3/34 | (2006.01) |

(52) U.S. Cl.
CPC ............. *H05K 1/113* (2013.01); *H05K 1/029* (2013.01); *H05K 1/0231* (2013.01); *H05K 1/111* (2013.01); *H05K 1/115* (2013.01); *H05K 1/18* (2013.01); *H05K 3/3442* (2013.01); *H05K 2201/0305* (2013.01); *H05K 2201/10636* (2013.01); *H05K 2203/173* (2013.01)

(58) Field of Classification Search
CPC ................................ H05K 1/181; H05K 1/18
See application file for complete search history.

(56) References Cited

U.S. PATENT DOCUMENTS

| | | | |
|---|---|---|---|
| 2004/0232452 A1 | 11/2004 | Tsuneoka et al. | |
| 2005/0173151 A1* | 8/2005 | Shepherd ............... | H05K 1/114 174/250 |

FOREIGN PATENT DOCUMENTS

| | | |
|---|---|---|
| JP | 58-121662 A | 7/1983 |
| JP | 09-92537 A | 4/1997 |
| JP | 2001-144395 A | 5/2001 |
| JP | 2006-156512 A | 6/2006 |
| JP | 2010-067989 A | 3/2010 |
| JP | 2010-267903 A | 11/2010 |

OTHER PUBLICATIONS

Official Communication issued in International Patent Application No. PCT/JP2017/014160, dated Jul. 11, 2017.

* cited by examiner

*Primary Examiner* — Jeremy C Norris
(74) *Attorney, Agent, or Firm* — Keating & Bennett, LLP

(57) ABSTRACT

A module component includes a substrate; first, second, third and fourth main electrodes on or in a principal surface of the substrate; a sub-electrode located between two of the four main electrodes and connected to one of the four main electrodes by a solder; a first mount component mounted to the first and second main electrodes; and a second mount component mounted to the third and fourth main electrodes; wherein an area of the sub-electrode is smaller than an area of each of the first, second, third and fourth main electrodes.

20 Claims, 16 Drawing Sheets

MODULE COMPONENT

CROSS REFERENCE TO RELATED APPLICATIONS

This application claims the benefit of priority to Japanese Patent Application No. 2016-099998 filed on May 18, 2016 and is a Continuation Application of PCT Application No. PCT/JP2017/014160 filed on Apr. 4, 2017. The entire contents of each application are hereby incorporated herein by reference.

BACKGROUND OF THE INVENTION

1. Field of the Invention

The present invention relates to a module component.

2. Description of the Related Art

In the fields of electrical devices and communication devices, a module component including a mount component mounted to a circuit substrate has been developed (see, e.g., Japanese Unexamined Patent Application Publication No. 2010-67989).

In a module component disclosed in Japanese Unexamined Patent Application Publication No. 2010-67989, a circuit configuration including electronic components, wirings, etc. is designed in advance. To obtain the designed circuit configuration, the wirings are formed inside a circuit substrate, and electrodes are formed on a surface of the circuit substrate. The module component is formed by bonding mount components to the electrodes with solder, thus mounting the mount components to the circuit substrate.

In the related-art module component disclosed in Japanese Unexamined Patent Application Publication No. 2010-67989, however, because the layout of the wirings and the electrodes is designed depending on the circuit configuration, a design change is required whenever the circuit configuration is changed. Furthermore, labor and time are required to form the wirings and the electrodes in and on the circuit substrate in accordance with each design change. Moreover, the cost is increased due to the need of previously preparing a plurality of types of circuit substrates to be adaptable for various design changes.

SUMMARY OF THE INVENTION

Preferred embodiments of the present invention provide module components adaptable for a plurality of circuit configurations.

A module component according to a preferred embodiment of the present invention includes a substrate; a first main electrode on or in a principal surface of the substrate; a second main electrode on or in the principal surface and opposed to the first main electrode; a third main electrode on or in the principal surface at a position other than positions at which the first main electrode and the second main electrode are disposed; a fourth main electrode on or in the principal surface and opposed to the third main electrode; a sub-electrode between two of the first main electrode, the second main electrode, the third main electrode, and the fourth main electrode, and connected to one of the first main electrode, the second main electrode, the third main electrode, and the fourth main electrode by a conductive bonding member; a first mount component connected to the first main electrode and the second main electrode; and a second mount component connected to the third main electrode and the fourth main electrode, wherein an area of the sub-electrode is smaller than an area of each of the first main electrode, the second main electrode, the third main electrode, and the fourth main electrode.

With this structure, in the module component, one of the first main electrode, the second main electrode, the third main electrode, and the fourth main electrode is connected to the sub-electrode only by the conductive bonding member. Accordingly, a wiring pattern to connect one of the first main electrode, the second main electrode, the third main electrode, and the fourth main electrode to the sub-electrode is not required to be previously provided on or in the substrate, and a circuit configuration is able to be easily changed by changing the layout of the conductive bonding member.

In a module component according to a preferred embodiment of the present invention, the sub-electrode is disposed at least at one of positions between the first main electrode and the second main electrode and between the third main electrode and the fourth main electrode.

With this structure, the sub-electrode is provided on or in the principal surface under one or both of the first mount component and the second mount component. Therefore, a region in which the conductive bonding member connecting the main electrode and the sub-electrode is to be extended and spread is able to be controlled. As a result, the main electrode and the sub-electrode are able to be connected satisfactorily.

In a module component according to a preferred embodiment of the present invention, the sub-electrode is disposed at least at one of positions between the first main electrode and one of the third main electrode and the fourth main electrode closer to the first main electrode, and between the second main electrode and one of the third main electrode and the fourth main electrode closer to the second main electrode.

With this structure, since the sub-electrode is connected to the main electrode by the conductive bonding member, a wiring pattern is not required to be previously provided on or in the substrate, and the sub-electrode and the main electrode are able to be connected by the conductive bonding member.

In a module component according to a preferred embodiment of the present invention, at least one pair of main electrodes between a pair of the first main electrode and one of the third main electrode and the fourth main electrode closer to the first main electrode, and a pair of the second main electrode and one of the third main electrode and the fourth main electrode closer to the second main electrode, are connected via the sub-electrode.

With this structure, since the sub-electrode between two main electrodes is connected to the two main electrodes by the conductive bonding member, the two main electrodes are able to be connected via the sub-electrode even when a distance between the two main electrodes is relatively long.

In a module component according to a preferred embodiment of the present invention, the sub-electrode is connected to the first mount component or the second mount component via at least one among the first main electrode, the second main electrode, the third main electrode, and the fourth main electrode.

With this structure, since the sub-electrode is connected to the mount component via the main electrode, a signal, such as a current or a voltage, is able to be supplied from the sub-electrode to the mount component via the main electrode.

In a module component according to a preferred embodiment of the present invention, the sub-electrode is grounded.

With this feature, the sub-electrode is able to be used as a ground electrode.

In a module component according to a preferred embodiment of the present invention, one of the first main electrode, the second main electrode, the third main electrode, and the fourth main electrode is connected to an input wiring.

With this structure, a wiring connected to one of the main electrodes, the one being connected to the mount component, is able to be used as a wiring through which an input signal is supplied to the mount component.

In a module component according to a preferred embodiment of the present invention, one of the first main electrode, the second main electrode, the third main electrode, and the fourth main electrode is connected to an output wiring.

With this structure, a wiring connected to one of the main electrodes, the one being connected to the mount component, is able to be used as a wiring through which a signal is output from the mount component.

In a module component according to a preferred embodiment of the present invention, the sub-electrode is connected to one of the first main electrode, the second main electrode, the third main electrode, and the fourth main electrode, the one being connected to the input wiring.

With this structure, a wiring path is able to be branched from one of the first main electrode, the second main electrode, the third main electrode, and the fourth main electrode, the one being connected to the input wiring.

In a module component according to a preferred embodiment of the present invention, the sub-electrode is connected to one of the first main electrode, the second main electrode, the third main electrode, and the fourth main electrode, the one being connected to the output wiring.

With this structure, a wiring path is able to be branched from one of the first main electrode, the second main electrode, the third main electrode, and the fourth main electrode, the one being connected to the output wiring.

In a module component according to a preferred embodiment of the present invention, a plurality of the sub-electrodes are disposed in at least at one of positions between the first main electrode and the second main electrode and between the third main electrode and the fourth main electrode.

With this structure, since it is possible to use the sub-electrode positioned closer to the main electrode for which the connection is to be made, bonding properties between the sub-electrode and the main electrode are improved.

In a module component according to a preferred embodiment of the present invention, the sub-electrode overlaps the first mount component or the second mount component and is positioned along a lateral surface of the first mount component or the second mount component when viewing the module component in plan.

With this structure, since the sub-electrode is positioned along the lateral surface of the first mount component or the second mount component, the electrode is not disposed at a position in which the electrode impedes magnetic force lines directed toward a region under the first mount component or the second mount component. As a result, characteristics of the module component are improved.

In a module component according to a preferred embodiment of the present invention, one of the first main electrode, the second main electrode, the third main electrode, and the fourth main electrode, excluding the one of the first main electrode, the second main electrode, the third main electrode, and the fourth main electrode connected to the input wiring, is connected to the output wiring, and the first mount component and the second mount component are connected in parallel to each other and are connected in series between the input wiring and the output wiring.

In a module component according to a preferred embodiment of the present invention, one of the first main electrode, the second main electrode, the third main electrode, and the fourth main electrode, excluding the one of the first main electrode, the second main electrode, the third main electrode, and the fourth main electrode connected to the input wiring, is connected to the output wiring, and the first mount component and the second mount component are connected in series to each other and are connected between the input wiring and the output wiring so as to be branched from a wiring interconnecting the input wiring and the output wiring.

In a module component according to a preferred embodiment of the present invention, one of the first main electrode, the second main electrode, the third main electrode, and the fourth main electrode, excluding the one of the first main electrode, the second main electrode, the third main electrode, and the fourth main electrode connected to the input wiring, is connected to the output wiring, and the first mount component and the second mount component are connected in parallel to each other and are connected between the input wiring and the output wiring so as to be branched from a wiring interconnecting the input wiring and the output wiring.

In a module component according to a preferred embodiment of the present invention, one of the first main electrode, the second main electrode, the third main electrode, and the fourth main electrode, excluding the one of the first main electrode, the second main electrode, the third main electrode, and the fourth main electrode connected to the input wiring, is connected to the output wiring, and the first mount component and the second mount component are connected in series to each other and are connected in series between the input wiring and the output wiring.

With this structure, even when circuit configurations of a serial circuit and a parallel circuit each defined by the first mount component and the second mount component are changed, the change is able to be adapted using one substrate.

A module component according to a preferred embodiment of the present invention further includes a fifth main electrode at a position other than positions at which the first main electrode, the second main electrode, the third main electrode, and the fourth main electrode are provided; a sixth main electrode at a position opposed to the fifth main electrode; and a third mount component connected to the fifth main electrode and the sixth main electrode, wherein one of the first mount component, the second mount component, and the third mount component is connected in series between the input wiring and the output wiring, another one of the first mount component, the second mount component, and the third mount component is connected between the input wiring and one of the first mount component, the second mount component, and the third mount component, the one connected in series to the input wiring, so as to be branched from a wiring interconnecting the input wiring and the output wiring, and the remaining one of the first mount component, the second mount component, and the third mount component is connected between one of the first mount component, the second mount component, and the third mount component, the one being connected in series to the output wiring, and the output wiring so as to be branched from the wiring interconnecting the input wiring and the output wiring.

With this structure, the configuration of a Δ-connected circuit is able to be achieved by changing the connections of the first mount component, the second mount component, and the third main electrode in one substrate.

A module component according to a preferred embodiment of the present invention further includes a fifth main electrode at a position other than positions at which the first main electrode, the second main electrode, the third main electrode, and the fourth main electrode are provided; a sixth main electrode at a position opposed to the fifth main electrode; and a third mount component mounted to the fifth main electrode and the sixth main electrode, wherein two of the first mount component, the second mount component, and the third mount component are connected in series between the input wiring and the output wiring, and the remaining one of the first mount component, the second mount component, and the third mount component is connected between the first mount component and the second mount component so as to be branched from a wiring interconnecting the input wiring and the output wiring.

With this structure, the configuration of a Y-connected circuit is able to be achieved by changing the connections of the first mount component, the second mount component, and the third main electrode in one substrate.

In a module component according to a preferred embodiment of the present invention, the second main electrode or the fourth main electrode closest to the first main electrode or the third main electrode is connected to the closest of the first main electrode or the closest third main electrode with the sub-electrode not interposed therebetween.

With this structure, since lateral surfaces of the main electrodes are connected to each other only by the conductive bonding member, a wiring pattern to connect the main electrodes is not required to be previously provided on or in the substrate, and the main electrodes is able to be easily bonded to each other by changing layout of the conductive bonding member.

A module component according to a preferred embodiment of the present invention includes a substrate; a first main electrode on or in a principal surface of the substrate; a second main electrode on or in the principal surface and opposed to the first main electrode; a first sub-electrode and a second sub-electrode on or in the principal surface between the first main electrode and the second main electrode; and a first mount component connected to the first main electrode and the second main electrode, wherein an area of each of the first sub-electrode and the second sub-electrode is smaller than an area of each of the first main electrode and the second main electrode, the first sub-electrode is connected by a conductive bonding member to the first main electrode or the second main electrode, and the second sub-electrode is connected by a conductive bonding member to the first main electrode or the second main electrode to which the first sub-electrode is not connected.

With this structure, since the sub-electrode and the first main electrode or the second main electrode are connected only by the conductive bonding member in one substrate, a wiring pattern connecting the sub-electrode and the first main electrode or the second main electrode is not required to be previously provided on or in the substrate, and the direction of a current flowing through the first mount component is able to be easily changed by changing the layout of the conductive bonding member. Thus, a magnetic field provided by the first mount component to the surroundings is able to be changed.

According to preferred embodiments of the present invention, module components each adaptable for a plurality of circuit configurations are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
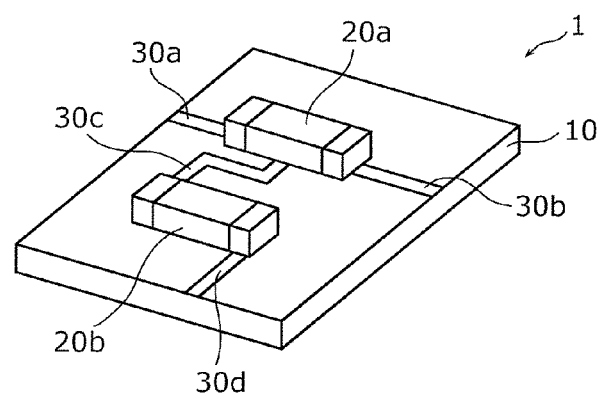
FIG. 1 is a conceptual view illustrating a configuration of a module component according to Preferred Embodiment 1 of the present invention.

Preferred embodiments of the present invention will be described below with reference to the drawings. It is to be noted that any of the following preferred embodiments represents a preferred practical example of the present invention. Accordingly, numerical values, shapes, materials, elements, positions and connection structures of the elements, steps, sequences of the steps, etc., which are described in the following preferred embodiments, are merely illustrative, and they are not intended to limit the scope of the present invention. Among the elements in the following preferred embodiments, those not stated in independent Claims representing the most significant concept of the present invention are explained as optional elements.

Individual drawings are schematic views and are not always exactly illustrated in a strict sense. In the drawings, substantially the same elements are denoted by the same reference characters, and duplicate description of those elements is omitted or simplified. For easier understanding, solder is denoted by hatching in the drawings.

Preferred Embodiment 1

Preferred Embodiment 1 of the present invention will be described below with reference to FIGS. 1 to 3B. A module component 1 mounted to a substrate 40 is described in the present preferred embodiment.

FIG. 1 is a conceptual view illustrating a configuration of the module component 1 according to the present preferred embodiment.

Figure 2A:
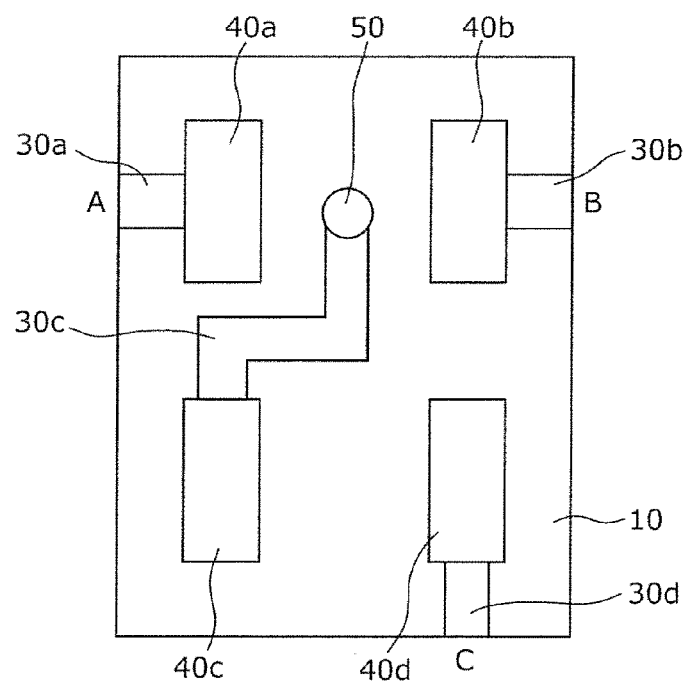
FIG. 2A is a plan view illustrating one example of an electrode pattern in the module component according to Preferred Embodiment 1 of the present invention.

On or in a principal surface of a substrate 10, the module component 1 includes, as illustrated in FIG. 1, a first mount component 20a, a second mount component 20b, and wirings 30a, 30b, 30c and 30d, and, as illustrated in FIG. 2A, a first main electrode 40a, a second main electrode 40b, a third main electrode 40c, a fourth main electrode 40d (see FIG. 2A), and a sub-electrode 50 (see FIG. 2A)

The substrate 10 is preferably, for example, a printed substrate or an LTCC (Low Temperature Co-fired Ceramics) substrate.

The first mount component 20a and the second mount component 20b are preferably, for example, components such as a capacitor and an inductor. Each of the first mount component 20a and the second mount component 20b includes electrode portions at both ends to be connectable to the first main electrode 40a, the second main electrode 40b, the third main electrode 40c, and the fourth main electrode 40d.

FIG. 2A is a plan view illustrating one example of an electrode pattern in the substrate 10 of the module component 1 according to the present preferred embodiment.

As illustrated in FIG. 2A, the first main electrode 40a, the second main electrode 40b, the third main electrode 40c, and the fourth main electrode 40d are provided on or in the substrate 10. The second main electrode 40b is opposed to the first main electrode 40a. The third main electrode is provided at a position other than the positions at which the first main electrode and the second main electrode are provided. The fourth main electrode is opposed to the third main electrode, and is provided at a position other than the positions at which the first main electrode, the second main electrode, and the third main electrode are provided. The first main electrode 40a, the second main electrode 40b, the third main electrode 40c, and the fourth main electrode 40d are preferably made of a Cu—Ni-based material, for example. The first main electrode 40a, the second main electrode 40b, the third main electrode 40c, and the fourth main electrode 40d may be made of another material, i.e., aluminum, for example.

Each of the first main electrode 40a, the second main electrode 40b, the third main electrode 40c, and the fourth main electrode 40d preferably has a rectangular or substantially rectangular shape with a long side of about 200 μm and a short side of about 90 μm, for example.

The first main electrode 40a and the second main electrode 40b are provided on the substrate 10 so as to oppose each other such that their long sides are parallel or substantially parallel to each other. A distance between the first main electrode 40a and the second main electrode 40b is preferably about 220 μm, for example. Similarly, the third main electrode 40c and the fourth main electrode 40d are provided on the substrate 10 so as to oppose each other such that their long sides are parallel or substantially parallel to each other. A distance between the third main electrode 40c and the fourth main electrode 40d is preferably about 220 μm, for example.

Furthermore, the third main electrode 40c is provided on or in the principal surface of the substrate 10 and opposed to the first main electrode 40a such that their short sides are parallel or substantially parallel to each other. A distance between the first main electrode 40a and the third main electrode 40c is preferably about 125 μm, for example. Similarly, the fourth main electrode 40d is provided on or in the principal surface of the substrate 10 and opposed to the second main electrode 40b such that their short sides are parallel or substantially parallel to each other. A distance between the second main electrode 40b and the fourth main electrode 40d is preferably about 125 μm, for example.

The first main electrode 40a is connected to one end of the wiring 30a. The wiring 30a is preferably made of a Cu—Ni-based material, for example. A width of the wiring 30a is preferably about 75 μm, for example. The other end of the wiring 30a is connected to a terminal A (e.g., an input terminal).

The second main electrode 40b is connected to one end of the wiring 30b. The other end of the wiring 30b is connected to a terminal B (e.g., an output terminal). A material and a width of the wiring 30b are the same as or similar to those of the wiring 30a. Thus, detailed description of the material and the width is omitted. The wiring 30a and the wiring 30b correspond to an input wiring and an output wiring, respectively.

The sub-electrode 50 is provided on or in the principal surface of the substrate 10 between the first main electrode 40a and the second main electrode 40b. The sub-electrode 50 is preferably made of a Cu—Ni-based material, for example. The sub-electrode 50 may be made of another material, i.e., aluminum, for example. An area of the sub-electrode 50 is smaller than that of each of the first main electrode 40a, the second main electrode 40b, the third main electrode 40c, and the fourth main electrode 40d. For instance, the sub-electrode 50 preferably has a circular or substantially circular shape with a diameter of about 90 μm. Alternatively, the sub-electrode 50 may have a rectangular, a triangular, or an elliptical shape, for example, other than the circular or substantially circular shape. A distance between the sub-electrode 50 and each of the first main electrode 40a and the second main electrode 40b is preferably about 65 μm, for example.

As described in detail below, the sub-electrode 50 is connected to the first main electrode 40a or the second main electrode 40b by solder 60a. Thus, the first main electrode 40a and the second main electrode 40b are electrically conducted to the first mount component 20a.

The sub-electrode 50 is further connected to the third main electrode 40c via the wiring 30c. The sub-electrode 50 may be connected to the fourth main electrode 40d via the wiring 30c without being limited to the third main electrode 40c.

Figure 2B:
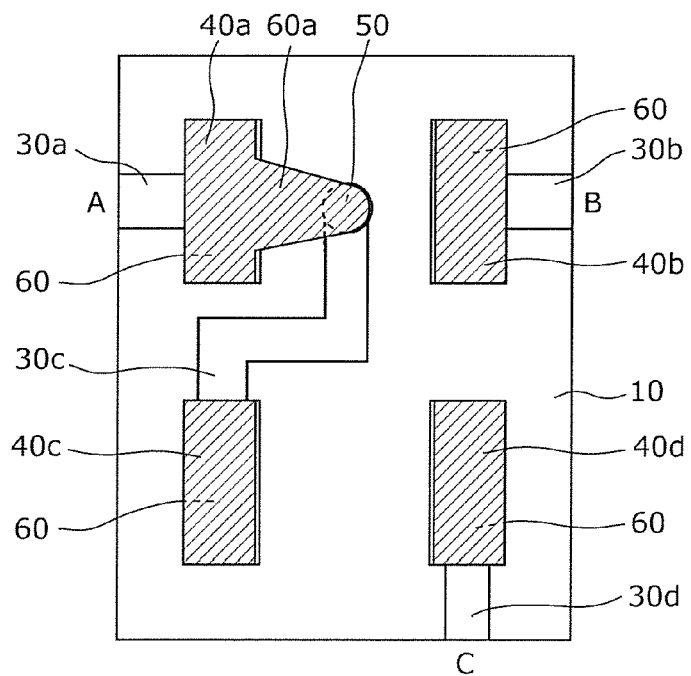
FIG. 2B is a plan view illustrating a connection example of a first main electrode and a first sub-electrode in the module component according to Preferred Embodiment 1 of the present invention.

FIG. 2B is a plan view illustrating a connection example of the first main electrode 40a and the sub-electrode 50 in the module component 1 according to the present preferred embodiment.

As illustrated in FIG. 2B, the first main electrode 40a and the sub-electrode 50 are connected by the solder 60a without using a wiring pattern. The solder 60a used here is integral with a solder 60 that is used to connect one end of the first mount component 20a and the first main electrode 40a. The solder 60a corresponds to a conductive bonding member.

The first mount component 20a and the first main electrode 40a are connected by applying the solder 60 between the electrode portion of the first mount component 20a and the first main electrode 40a. The solder 60 in a paste state is coated on the principal surface of the substrate 10 to connect the first mount component 20a and the first main electrode 40a. After heating and melting the coated solder, the solder is cooled to be solidified. A method of coating the solder 60 may be, for example, a method of placing, on the principal surface of the substrate 10, a metal mask including an opening in a region in which the solder is to be coated, and coating the solder over the region by a squeegee, or a method of preparing a sheet in which a coating pattern of the solder 60 is formed, and transferring the solder 60 onto the principal surface of the substrate 10. At this time, the first main electrode 40a and the sub-electrode 50 are also connected by applying the solder 60a to between the first main electrode 40a and the sub-electrode 50, and, after heating and melting the applied solder, cooling it to be solidified. By adjusting the amount and viscosity of the used solder 60a, the first main electrode 40a and the sub-electrode 50 is able to be connected only by the solder 60a without previously providing a wiring pattern on the substrate The sub-electrode 50 may be connected to the second main electrode 40b, as described later, without being limited to the first main electrode 40a.

Figure 2C:
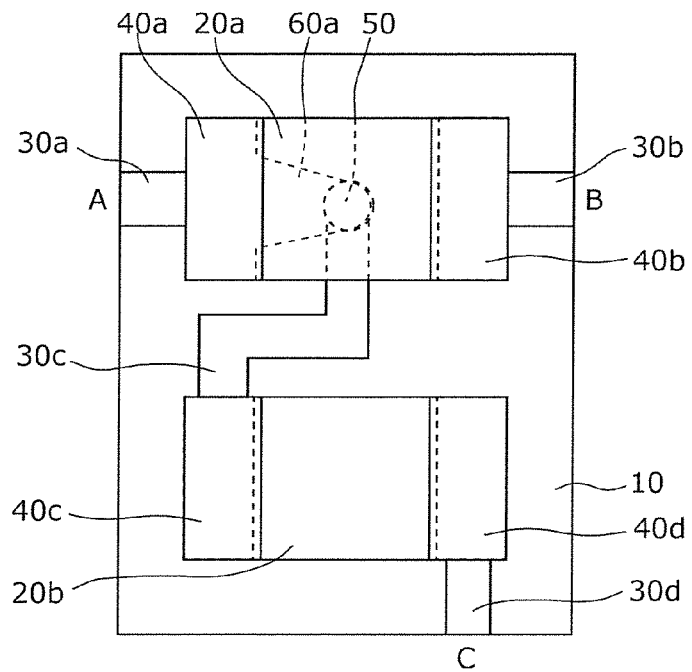
FIG. 2C is a plan view illustrating an example of a configuration of the module component according to Preferred Embodiment 1 of the present invention in which a first mount component and a second mount component are mounted.

FIG. 2C is a plan view illustrating an example of a configuration of the module component 1 according to the present preferred embodiment in which the first mount component 20a and the second mount component 20b are mounted to the substrate 10. In FIG. 2C, for easier understanding, the first main electrode 40a, the second main electrode 40b, the sub-electrode 50, and the solders 60 and 60a, which are positioned under the first mount component 20a and the second mount component 20b, are denoted by dotted lines.

As illustrated in FIG. 2C, the first mount component 20a is mounted over the first main electrode 40a and the second main electrode 40b. The first mount component 20a is preferably a capacitor, for example. The electrode portions provided at both the ends of the first mount component 20a are connected to the first main electrode 40a and the second main electrode 40b, respectively. Furthermore, the first main electrode 40a is connected to the third main electrode 40c via the sub-electrode 50. Thus, the first mount component 20a is connected to the second mount component 20b via the sub-electrode 50.

The second mount component 20b is mounted over the third main electrode 40c and the fourth main electrode 40d. The second mount component 20b is also preferably a capacitor, for example, as with the first mount component 20a.

The electrode portions provided at both the ends of the second mount component 20b are connected to the third main electrode 40c and the fourth main electrode 40d, respectively. Furthermore, the fourth main electrode 40d is connected to one end of the wiring 30d. The other end of the wiring 30d is connected to a terminal C. In the present preferred embodiment, the terminal C is connected to a ground. The terminal C may be connected to, instead of the ground, a not-illustrated circuit element via a wiring.

Figure 3A:
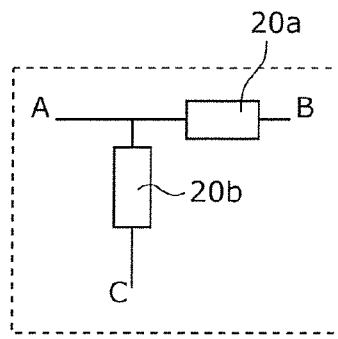
FIG. 3A is a plan view illustrating a connection example of the first mount component and the second mount component in the module component according to Preferred Embodiment 1 of the present invention.

With the above-described structure, a circuit illustrated in FIG. 3A is provided in the module component 1 illustrated in FIG. 2C. FIG. 3A is a plan view illustrating a connection example of the first mount component and the second mount component in the module component according to the present preferred embodiment.

In the module component 1, as illustrated in FIGS. 2C and 3A, the first main electrode 40a is connected to the third main electrode 40c via the sub-electrode 50. Thus, the first mount component 20a is connected to the second mount component 20b via the sub-electrode 50. Here, the first mount component 20a is connected in series between the wiring 30a, which is the input wiring, and the wiring 30b, which is the output wiring. Furthermore, the second mount component 20b is connected between the terminal A and the first mount component 20a so as to be branched from a wiring interconnecting the wiring 30a, which is the input wiring, and the wiring 30b, which is the output wiring. The wiring 30d is connected to the ground.

The module component 1 has the above-described configuration.

Figure 2D:
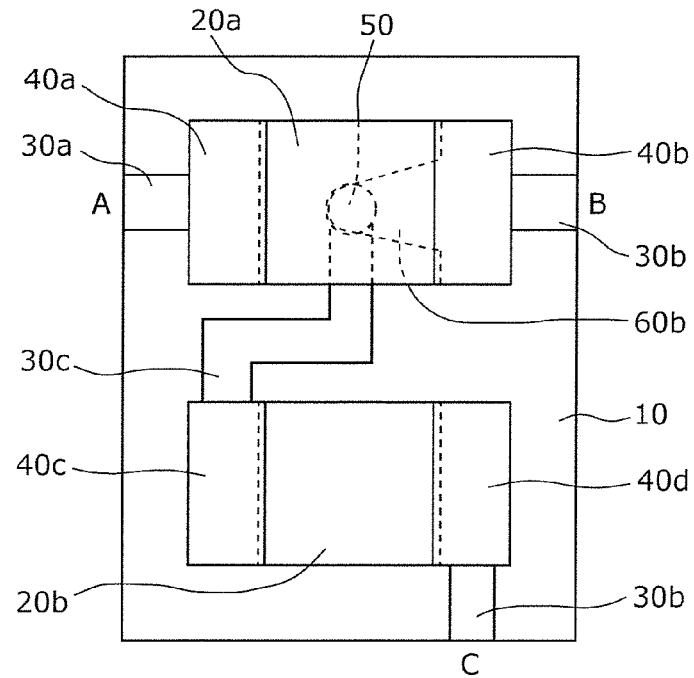
FIG. 2D is a plan view illustrating an example of a configuration of the module component according to Preferred Embodiment 1 of the present invention in which the first mount component and the second mount component are mounted.
Figure 3B:
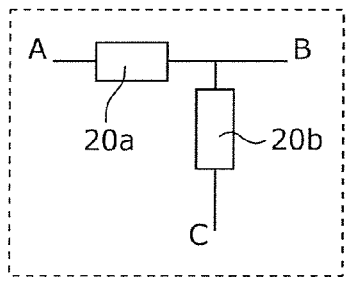
FIG. 3B is a plan view illustrating another connection example of the first mount component and the second mount component in the module component according to Preferred Embodiment 1 of the present invention.

The module component 1 is not limited to the above-described configuration, and it may be a module component having the following configuration. FIG. 2D is a plan view illustrating an example of a configuration of the module component according to the present preferred embodiment in which the first mount component 20a and the second mount component 20b are mounted. FIG. 3B is a plan view illustrating another connection example of the first mount component 20a and the second mount component 20b in the module component according to the present preferred embodiment.

In the module component illustrated in FIG. 2D, the sub-electrode 50 may be connected to the second main electrode 40b instead of the first main electrode 40a. A method of connecting the sub-electrode 50 and the second main electrode 40b is the same as or similar to that in the above-described module component 1.

In the module component illustrated in FIGS. 2D and 3B, the second main electrode 40b is connected to the third main electrode 40c via the sub-electrode 50. Thus, the first mount component 20a is connected to the second mount component 20b via the sub-electrode 50. Here, the first mount component 20a is connected in series between the wiring 30a, which is the input wiring, and the wiring 30b, which is the output wiring. Furthermore, the second mount component 20b is connected between the terminal B and the first mount component 20a so as to be branched from a wiring interconnecting the wiring 30a, which is the input wiring, and the wiring 30b, which is the output wiring. The wiring 30d is connected to the ground.

The module component illustrated in FIG. 2D has the above-described configuration.

With the module component 1 according to the present preferred embodiment, as described above, the first main electrode 40a or the second main electrode 40b is connected to the sub-electrode 50 only by the solder 60a. Therefore, the circuit configuration is able to be easily changed by changing the layout of the solder 60a without previously providing a wiring pattern for connection between each of the first main electrode 40a and the second main electrode 40b and the sub-electrode 50 in the substrate 10. It is thus possible to provide the module component that is adaptable for a plurality of circuit configurations using one substrate.

While Preferred Embodiment 1 has been described above regarding the configuration in which the first main electrode 40a or the second main electrode 40b is connected to the sub-electrode 50, the configuration may be modified such that the sub-electrode 50 is provided between the third main electrode 40c and the fourth main electrode 40d, and that the third main electrode 40c or the fourth main electrode 40d is connected to the sub-electrode 50.

Preferred Embodiment 2

Preferred Embodiment 2 of the present invention will be described below with reference to FIGS. 4A to 4C.

Figure 4A:
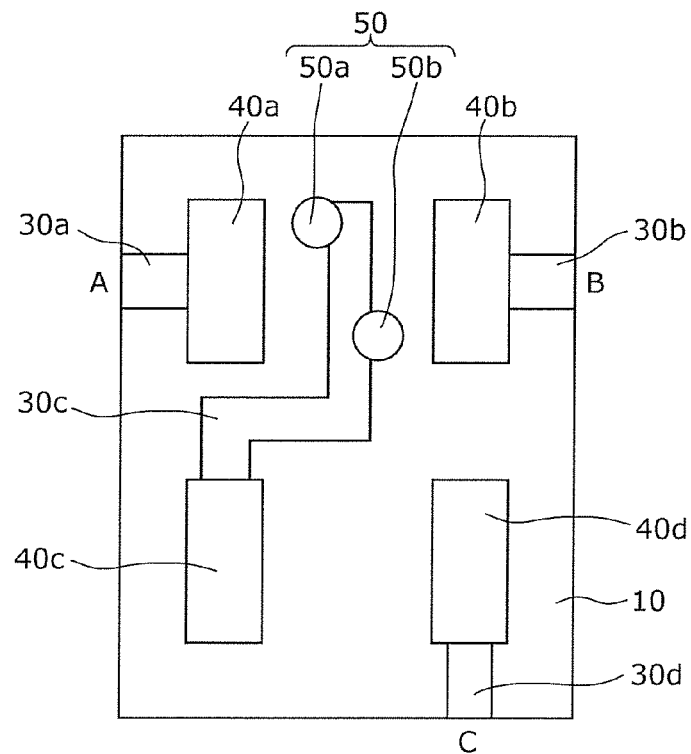
FIG. 4A is a plan view illustrating one example of an electrode pattern in a module component according to Preferred Embodiment 2 of the present invention.

FIG. 4A is a plan view illustrating one example of an electrode pattern in a module component according to the present preferred embodiment. FIGS. 4B and 4C are each a plan view illustrating an example of a configuration of the module component according to the present preferred embodiment in which a first mount component and a second mount component are mounted.

The module component according to the present preferred embodiment is different from the module component 1 according to Preferred Embodiment 1 in that the sub-electrode 50 is defined by a plurality of sub-electrodes, i.e., a first sub-electrode 50a and a second sub-electrode 50b. The remaining configuration is the same as or similar to that in the module component 1 according to Preferred Embodiment 1, and thus detailed description of the remaining configuration is omitted.

As illustrated in FIG. 4A, the sub-electrode 50 is defined by the first sub-electrode 50a and the second sub-electrode 50b on or in the principal surface of the substrate 10. A material defining the first sub-electrode 50a and the second sub-electrode 50b is similar to that of the sub-electrode 50 described in Preferred Embodiment 1.

The first sub-electrode 50a preferably has a circular or substantially circular shape with a diameter of about 90 μm, for example. The first sub-electrode 50a is provided at a position closer to the first main electrode 40a than a midpoint between the first main electrode 40a and the second main electrode 40b. A distance between the first sub-electrode 50a and the first main electrode 40a is preferably about 20 μm, for example.

Here, as illustrated in FIG. 4A, the wiring 30c is provided at a midpoint between the first main electrode 40a and the second main electrode 40b. Accordingly, the wiring 30c partially overlaps the first sub-electrode 50a when viewed in plan. An area of an overlapped region between the first sub-electrode 50a and the wiring 30c is preferably, for example, about ½ of the first sub-electrode 50a.

Figure 4B:
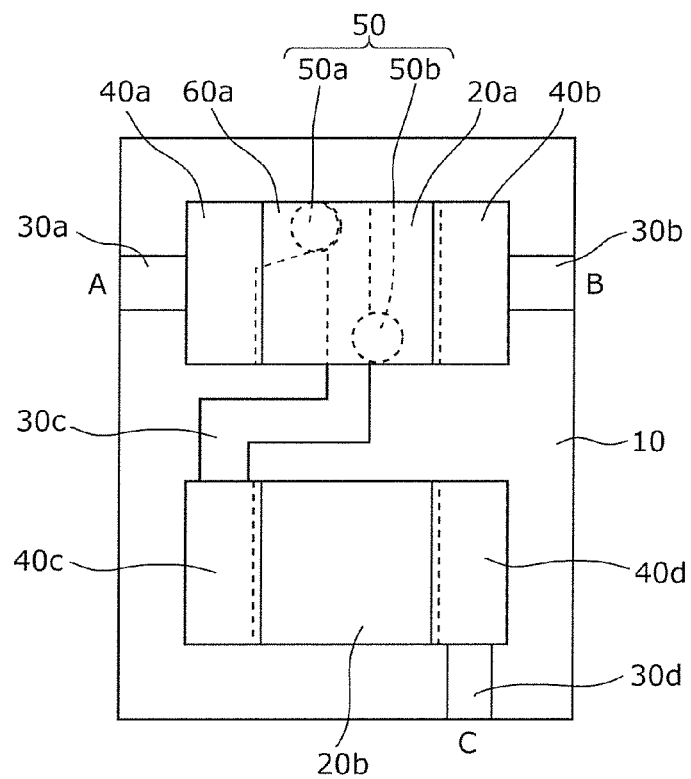
FIG. 4B is a plan view illustrating an example of a configuration of the module component according to Preferred Embodiment 2 of the present invention in which a first mount component and a second mount component are mounted.

Thus, since the first sub-electrode 50a is provided at the position closer to the first main electrode 40a, the first main electrode 40a and the first sub-electrode 50a are able to be easily connected by the solder 60a without using a wiring pattern, as illustrated in FIG. 4B. In the module component according to the present preferred embodiment, therefore, the first sub-electrode 50a and the first main electrode 40a are able to be easily connected As with the first sub-electrode 50a, the second sub-electrode 50b preferably has a circular or substantially circular shape with a diameter of about 90 μm, for example. The second sub-electrode 50b is provided at a position closer to the second main electrode 40b than the midpoint between the first main electrode 40a and the second main electrode 40b. A distance between the second sub-electrode 50b and the second main electrode 40b is preferably about 20 μm, for example. Furthermore, an area of an overlapped region between the second sub-electrode 50b and the wiring 30c is preferably, for example, about ½ of the second sub-electrode 50b.

Figure 4C:
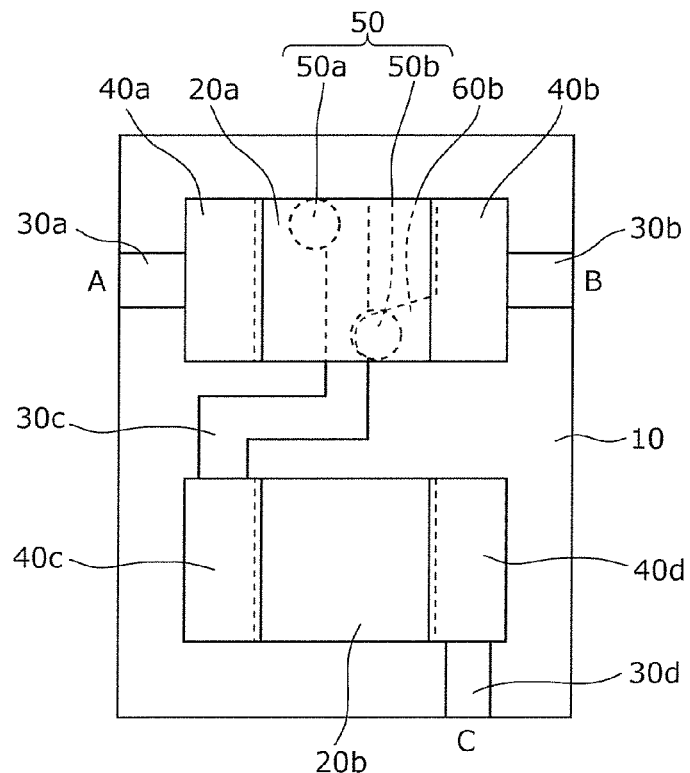
FIG. 4C is a plan view illustrating an example of a configuration of the module component according to Preferred Embodiment 2 of the present invention in which the first mount component and the second mount component are mounted.

Thus, since the second sub-electrode 50b is provided at the position closer to the second main electrode 40b, the second main electrode 40b and the second sub-electrode 50b are able to be easily connected by the solder 60b without using a wiring pattern, as illustrated in FIG. 4C. In the module component according to the present preferred embodiment, therefore, the second sub-electrode 50b and the second main electrode 40b are able to be easily connected.

Preferred Embodiment 3

Preferred Embodiment 3 of the present invention will be described below with reference to FIGS. 5A to 5C.

Figure 5A:
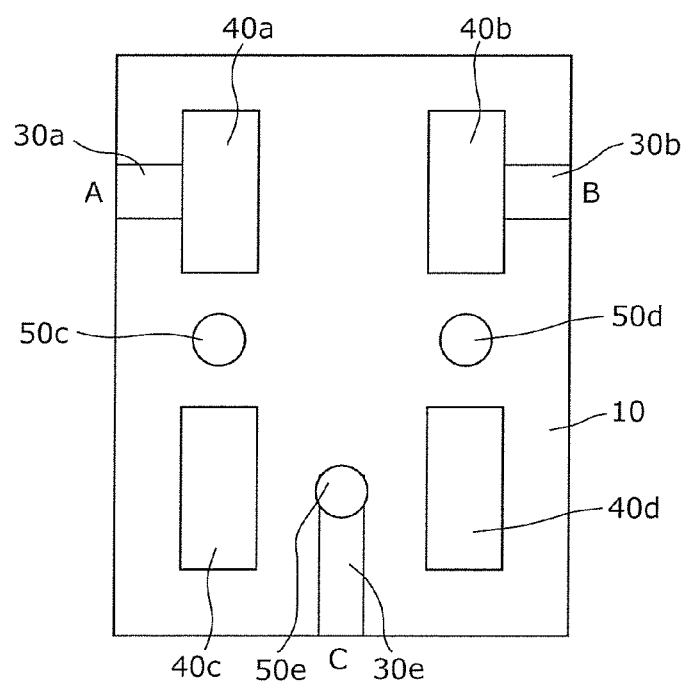
FIG. 5A is a plan view illustrating one example of an electrode pattern in a module component according to Preferred Embodiment 3 of the present invention.

FIG. 5A is a plan view illustrating one example of an electrode pattern in a module component according to the present preferred embodiment. FIGS. 5B and 5C are each a plan view illustrating an example of a configuration of the module component according to the present preferred embodiment in which a first mount component and a second mount component are mounted.

The module component according to the present preferred embodiment is different from the module component 1 according to Preferred Embodiment 1 in that a sub-electrode 50c and a sub-electrode 50d are provided at positions not overlapping the first mount component 20a and the second mount component 20b when viewing the module component according to the present preferred embodiment in plan.

More specifically, as illustrated in FIG. 5A, the sub-electrode 50c is disposed between the first main electrode 40a and the third main electrode 40c on or in the principal surface of the substrate 10. Furthermore, the sub-electrode 50d is disposed between the second main electrode 40b and the fourth main electrode 40d.

As with the sub-electrode 50 described in Preferred Embodiment 1, the sub-electrode 50c and the sub-electrode 50d are preferably made of a Cu—Ni-based material, for example. The sub-electrode 50c and the sub-electrode 50d preferably have a circular or substantially circular shape with a diameter of about 90 μm, for example.

Furthermore, as illustrated in FIG. 5A, the sub-electrode 50e is disposed between the third main electrode 40c and the fourth main electrode 40d. As with the sub-electrode 50 described in Preferred Embodiment 1, the sub-electrode 50e is preferably made of a Cu—Ni-based material, for example. The sub-electrodes 50c and 50d preferably have a circular or substantially circular shape with a diameter of about 90 μm, for example. One end of a wiring 30e is connected to the sub-electrode 50e. The wiring 30e is connected to the ground as with the wiring 30d described in Preferred Embodiment 1. The sub-electrode 50e is connected to the third main electrode 40c or the fourth main electrode 40d using solder.

Figure 5B:
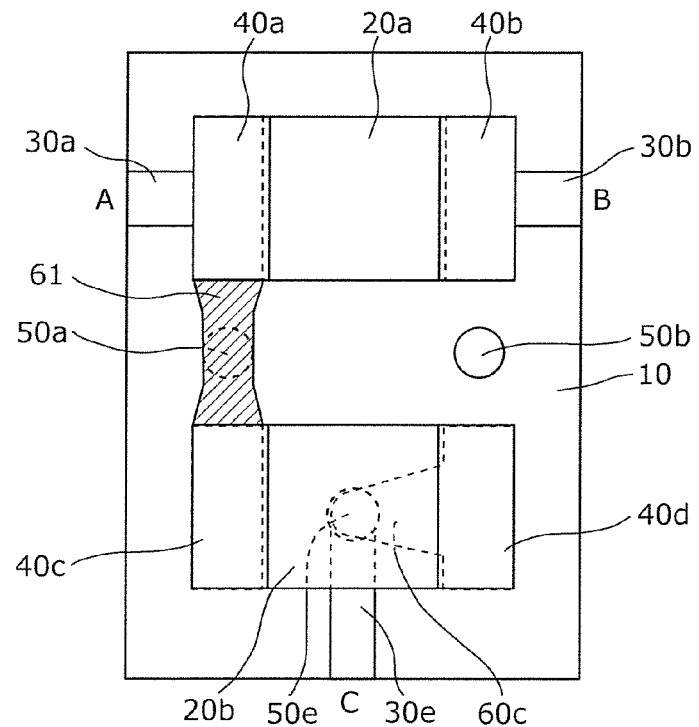
FIG. 5B is a plan view illustrating an example of a configuration of the module component according to Preferred Embodiment 3 in which a first mount component and a second mount component are mounted.

As illustrated in FIG. 5B, the sub-electrode 50c is connected to the first main electrode 40a and the third main electrode 40c by the solder 61 without using a wiring pattern. The solder 61 is integral with the solder 60 (not illustrated) that is used to connect the electrode portion of the first mount component 20a to the first main electrode 40a, and with the solder 60 (not illustrated) that is used to connect the electrode portion of the second mount component 20b to the third main electrode 40c.

Thus, since the sub-electrode 50c is disposed between the first main electrode 40a and the third main electrode 40c, the first main electrode 40a and the third main electrode 40c are able to be connected by the solder 61 via the sub-electrode 50c without using a wiring pattern. Accordingly, the first mount component 20a and the second mount component 20b are able to be connected without providing the wiring 30c described in Preferred Embodiment 1. As a result, the number of wirings to be previously provided on or in the substrate 10 is reduced. Moreover, the module component having a higher degree of design freedom of the circuit configuration is provided.

Figure 5C:
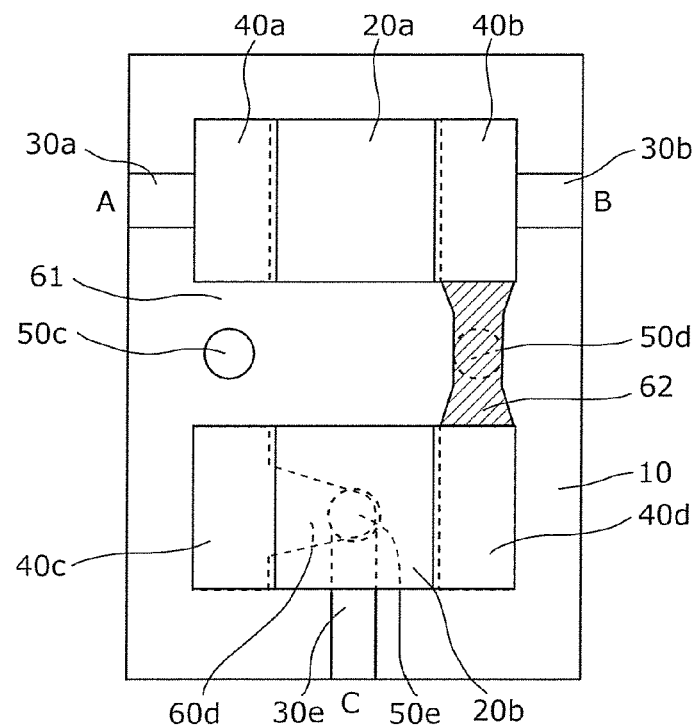
FIG. 5C is a plan view illustrating an example of a configuration of the module component according to Preferred Embodiment 3 of the present invention in which the first mount component and the second mount component are mounted.

Similarly, as illustrated in FIG. 5C, the sub-electrode 50d is connected to the second main electrode 40b and the fourth main electrode 40d by the solder 62. The solder 62 is integral with the solder 60 (not illustrated) that is used to connect the electrode portion of the first mount component 20a to the second main electrode 40b, and with the solder 60 (not illustrated) that is used to connect the electrode portion of the second mount component 20b to the fourth main electrode 40d.

Thus, with the sub-electrode 50d, as in the case in which the sub-electrode 50c is provided, the second main electrode 40b and the fourth main electrode 40d are able to be connected by the solder 62 via the sub-electrode 50d without using a wiring pattern. Accordingly, the first mount component 20a and the second mount component 20b are able to be connected without providing the wiring 30c described in Preferred Embodiment 1. It is thus possible to reduce the number of wirings to be previously provided on or in the substrate 10, and to achieve the module component having a higher degree of design freedom of the circuit configuration.

Preferred Embodiment 4

Preferred Embodiment 4 of the present invention will be described below with reference to FIGS. 6A to 6C.

Figure 6A:
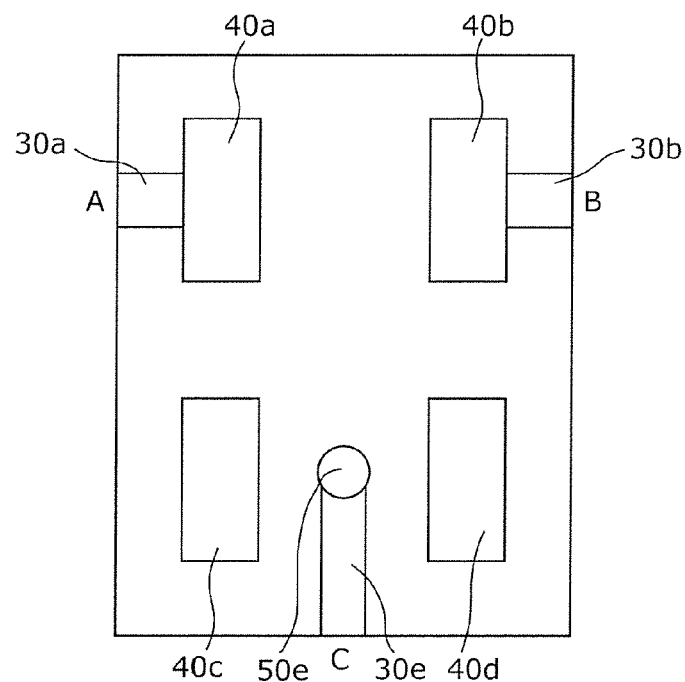
FIG. 6A is a plan view illustrating one example of an electrode pattern in a module component according to Preferred Embodiment 4 of the present invention.

FIG. 6A is a plan view illustrating one example of an electrode pattern in a module component according to the present preferred embodiment. FIGS. 6B and 6C are each a plan view illustrating an example of a configuration of the module component according to the present preferred embodiment in which a first mount component and a second mount component are mounted.

The module component according to the present preferred embodiment is different from the module component according to Preferred Embodiment 3 in that one of the first main electrode 40a and the second main electrode 40b to mount the first mount component 20a is directly connected to one of the third main electrode 40c and the fourth main electrode 40d to mount the second mount component 20b by solder without using the sub-electrode 50c or the sub-electrode 50d described in Preferred Embodiment 3.

As illustrated in FIG. 6A, the first main electrode 40a, the second main electrode 40b, the third main electrode 40c, and the fourth main electrode 40d are provided on or in the principal surface of the substrate 10. The sub-electrode 50e is between the third main electrode 40c and the fourth main electrode 40d. Furthermore, the first main electrode 40a is connected to the wiring 30a that is the input wiring. The second main electrode 40b is connected to the wiring 30b that is the output wiring. The sub-electrode 50e is connected to the wiring 30e that is connected to the ground.

Figure 6B:
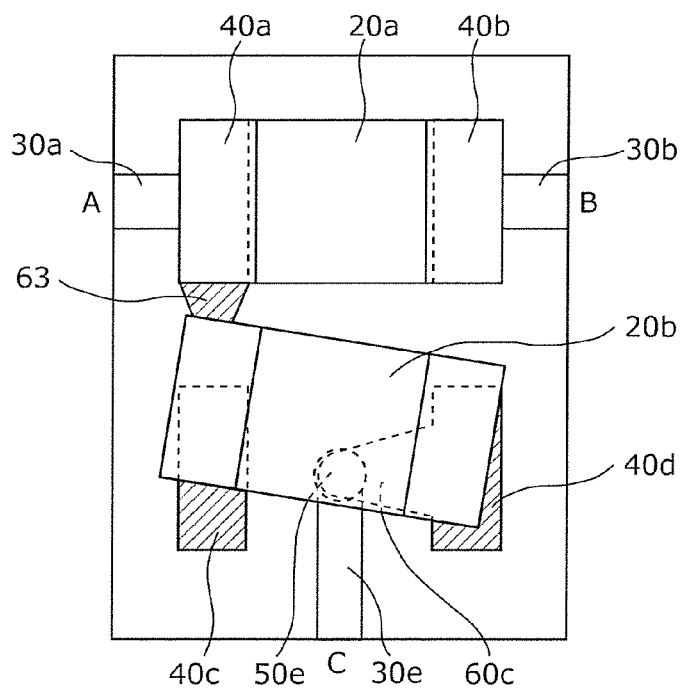
FIG. 6B is a plan view illustrating an example of a configuration of the module component according to Preferred Embodiment 4 of the present invention in which a first mount component and a second mount component are mounted.
Figure 6C:
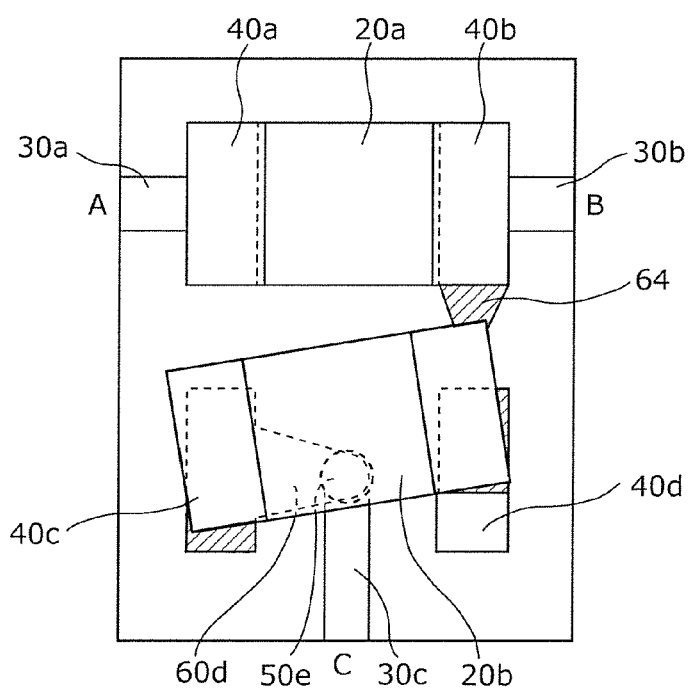
FIG. 6C is a plan view illustrating an example of a configuration of the module component according to Preferred Embodiment 4 of the present invention in which the first mount component and the second mount component are mounted.

As illustrated in FIG. 6B, the electrode portions at both of the ends of the first mount component 20a are connected respectively to the first main electrode 40a and the second main electrode 40c by the solder 60 (not illustrated). Furthermore, when the second mount component 20b is mounted to the substrate 10, the second mount component 20b is disposed such that the electrode portion of the second mount component 20b, which is connected to the third main electrode 40c, is positioned closer to the first mount component 20a. In other words, the first mount component 20a and the second mount component 20b are disposed such that a distance between the electrode portion of the first mount component 20a, which is connected to the first main electrode 40a, and the electrode portion of the second mount component 20b, which is connected to the third main electrode 40c, is shorter than a distance between the electrode portion of the first mount component 20a, which is connected to the second main electrode 40b, and the electrode portion of the second mount component 20b, which is connected to the fourth main electrode 40d. Moreover, the electrode portions at both of the ends of the second mount component 20b are connected respectively to the third main electrode 40c and the fourth main electrode 40d by the solder 60 (not illustrated).

In such a state, the electrode portion of the first mount component 20a on the same side as the first main electrode 40a and the electrode portion of the second mount component 20b on the same side as the third main electrode 40c are connected by the solder 63 without using a wiring pattern. The solder 63 is integral with the solder 60 (not illustrated) that is used to connect the first main electrode 40a and the electrode portion of the first mount component 20a, and with the solder 60 (not illustrated) that is used to connect the third main electrode 40c and the electrode portion of the second mount component 20b.

Furthermore, the sub-electrode 50e is connected to the fourth main electrode 40d by the solder 60c. The solder 60c is integral with the solder 60 (not illustrated) that is used to connect the fourth main electrode 40d and the electrode portion of the second mount component 20b.

It is thus possible to reduce the number of sub-electrodes and wirings to be previously provided on or in the substrate 10, and to achieve the module component having a higher degree of design freedom of the circuit configuration.

In the above-described structure, the position of the second mount component 20b is set such that the electrode portion of the second mount component 20b, which is connected to the third main electrode 40c, is closer to the first mount component 20a. However, as illustrated in FIG. 6C, the position of the second mount component 20b may be set such that the electrode portion of the second mount component 20b, which is connected to the fourth main electrode 40d, is closer to the first mount component 20a. In other words, the first mount component 20a and the second mount component 20b may be disposed such that the distance between the electrode portion of the first mount component 20a, which is connected to the second main electrode 40b, and the electrode portion of the second mount component 20b, which is connected to the fourth main electrode 40d, is shorter than the distance between the electrode portion of the first mount component 20a, which is connected to the first main electrode 40a, and the electrode portion of the second mount component 20b, which is connected to the third main electrode 40c. In such a case, the sub-electrode 50e may be connected to the fourth main electrode 40d by the solder 64 without using a wiring pattern.

Preferred Embodiment 5

Preferred Embodiment 5 of the present invention will be described below with reference to FIGS. 7A to 7E.

Figure 7A:
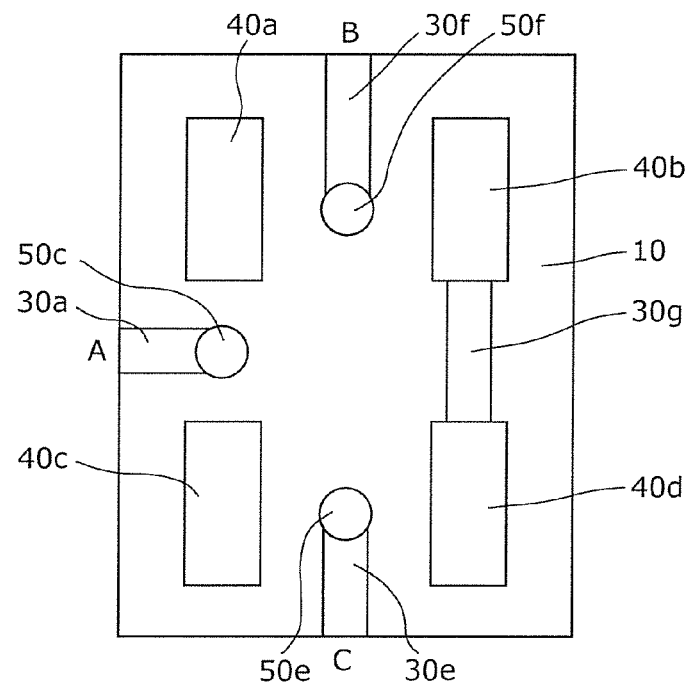
FIG. 7A is a plan view illustrating one example of an electrode pattern in a module component according to Preferred Embodiment 5 of the present invention.

FIG. 7A is a plan view illustrating one example of an electrode pattern in a module component according to the present preferred embodiment. FIGS. 7B to 7E are each a plan view illustrating an example of a configuration of the module component according to the present preferred embodiment in which a first mount component and a second mount component are mounted.

The module component according to the present preferred embodiment is different from the module component 1 according to Preferred Embodiment 1 in that the second main electrode 40b and the fourth main electrode 40d are connected by a wiring 30g. In other words, connections between the main electrodes may partially be a direct connection using a wiring without being limited to connection via a sub-electrode. The module component according to the present preferred embodiment is further different from the module component 1 according to Preferred Embodiment 1 in that sub-electrodes 50e and 50f are provided on or in the substrate 10 at positions under the first mount component 20a and the second mount component 20b, respectively.

More specifically, as illustrated in FIG. 7A, the sub-electrode 50c is between the first main electrode 40a and the third main electrode 40c on or in the principal surface of the substrate 10. The sub-electrode 50c is connected to the wiring 30a that is the input wiring. The sub-electrode 50f is between the first main electrode 40a and the second main electrode 40b. The sub-electrode 50f is connected to a wiring 30f that is the output wiring. The sub-electrode 50e is between the third main electrode 40c and the fourth main electrode 40d. The sub-electrode 50e is connected to the wiring 30e that is connected to the ground.

Furthermore, the second main electrode 40*b* and the fourth main electrode 40*d* are directly connected by the wiring 30*g*. In other words, because the second main electrode 40*b* and the fourth main electrode 40*d* are connected by a wiring pattern that is previously provided on or in the substrate 10, the circuit configuration cannot be modified to a configuration in which the second main electrode 40*b* and the fourth main electrode 40*d* are not connected.

The following four types of circuit configurations may be achieved with the module component according to the present preferred embodiment by providing the main electrodes and the sub-electrodes on or in the principal surface of the substrate 10 as described above, and by changing connections of the first main electrode 40*a*, the third main electrode 40*c*, and the sub-electrodes 50*e* and 50*f* with the use of solder.

Figure 7B:
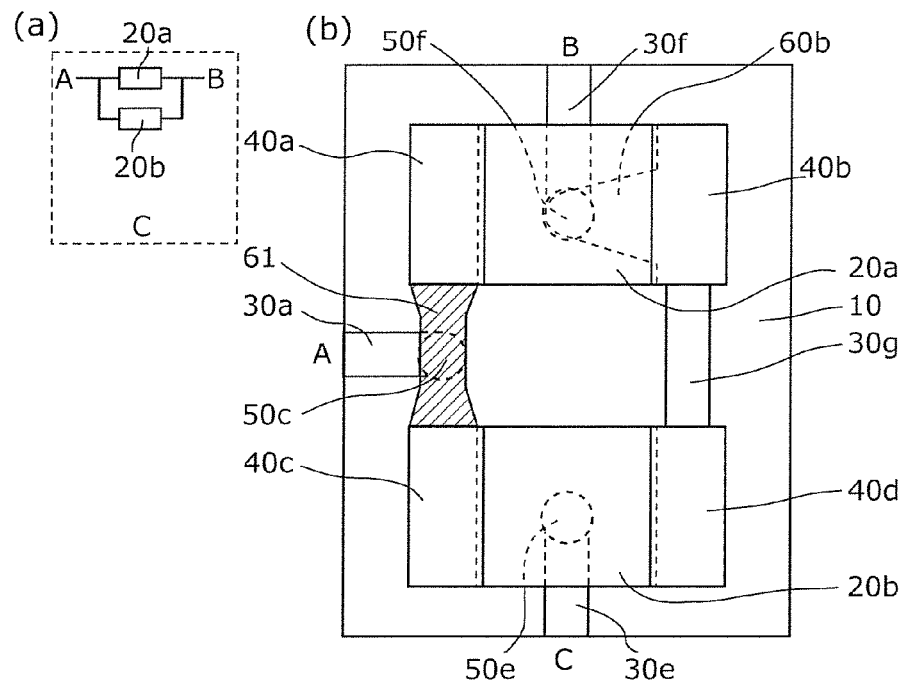
FIG. 7B is a plan view illustrating an example of a configuration of the module component according to Preferred Embodiment 5 of the present invention in which a first mount component and a second mount component are mounted.

As illustrated in (a) of FIG. 7B, the module component according to the present preferred embodiment may have a circuit configuration in which the first mount component 20*a* and the second mount component 20*b* connected in parallel to each other are connected in series between the terminal A (e.g., the input terminal) and the terminal B (e.g., the output terminal). In other words, the first mount component 20*a* and the second mount component 20*b* are connected in parallel to each other and are connected in series between the wiring 30*a* and the wiring 30*b*.

More specifically, as illustrated in (b) of FIG. 7B, in the module component according to the present preferred embodiment, the sub-electrode 50*c* is connected to the first main electrode 40*a* and the third main electrode 40*c* by the solder 61 without using a wiring pattern. The solder 61 used here is integral with the solder 60 (not illustrated) that is used to connect the electrode portion of the first mount component 20*a* to the first main electrode 40*a*, and with the solder 60 (not illustrated) that is used to connect the electrode portion of the second mount component 20*b* to the third main electrode 40*c*.

Furthermore, the sub-electrode 50*f* is connected to the second main electrode 40*b* by the solder 60*b* without using a wiring pattern. The solder 60*b* used here is integral with the solder 60 (not illustrated) that is used to connect the electrode portion of the first mount component 20*a* to the second main electrode 40*b*.

The sub-electrode 50*e* is not connected to any of the electrode portions of the first mount component 20*a* and the second mount component 20*b*.

With the above-described connections, the first mount component 20*a* and the second mount component 20*b* are connected in parallel to each other and are connected in series between the terminal A and the terminal B.

Figure 7C:
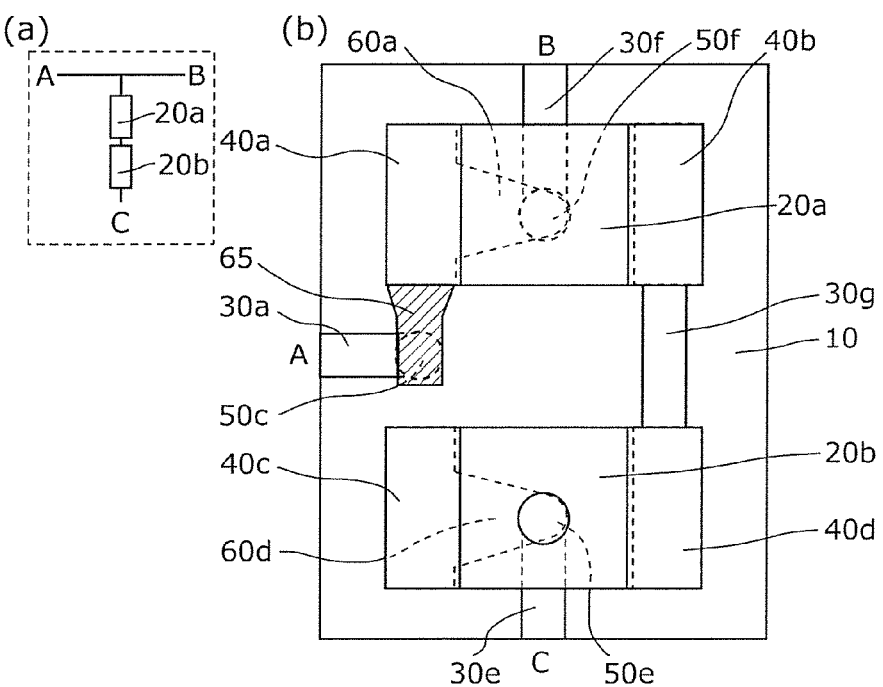
FIG. 7C is a plan view illustrating an example of a configuration of the module component according to Preferred Embodiment 5 of the present invention in which the first mount component and the second mount component are mounted.

As illustrated in (a) of FIG. 7C, the module component according to the present preferred embodiment may further have a circuit configuration in which the first mount component 20*a* and the second mount component 20*b* connected in series are connected between the terminal A terminal and the terminal B so as to be branched from a wiring that interconnects the terminal A terminal and the terminal B. In other words, the first mount component 20*a* and the second mount component 20*b* are connected in series to each other and are connected between the wiring 30*a* and the wiring 30*b* so as to be branched from the wiring that interconnects the wiring 30*a* and the wiring 30*b*.

More specifically, as illustrated in (b) of FIG. 7C, in the module component according to the present preferred embodiment, the sub-electrode 50*c* is connected to the first main electrode 40*a* by the solder 65 without using a wiring pattern. The sub-electrode 50*f* is connected to the first main electrode 40*a* by the solder 60*a* without using a wiring pattern. The solder 60*a* used here is integral with the solder 60 (not illustrated) that is used to connect the electrode portion of the first mount component 20*a* to the first main electrode 40*a*.

Furthermore, the sub-electrode 50*e* is connected to the third main electrode 40*c* by the solder 60*d* without using a wiring pattern. The solder 60*d* used here is integral with the solder 60 (not illustrated) that is used to connect the electrode portion of the second mount component 20*b* to the third main electrode 40*c*.

With the above-described connections, the first mount component 20*a* and the second mount component 20*b* are connected in series to each other and are connected between the terminal A and the terminal B so as to be branched from the wiring that interconnects the terminal A and the terminal B.

Figure 7D:
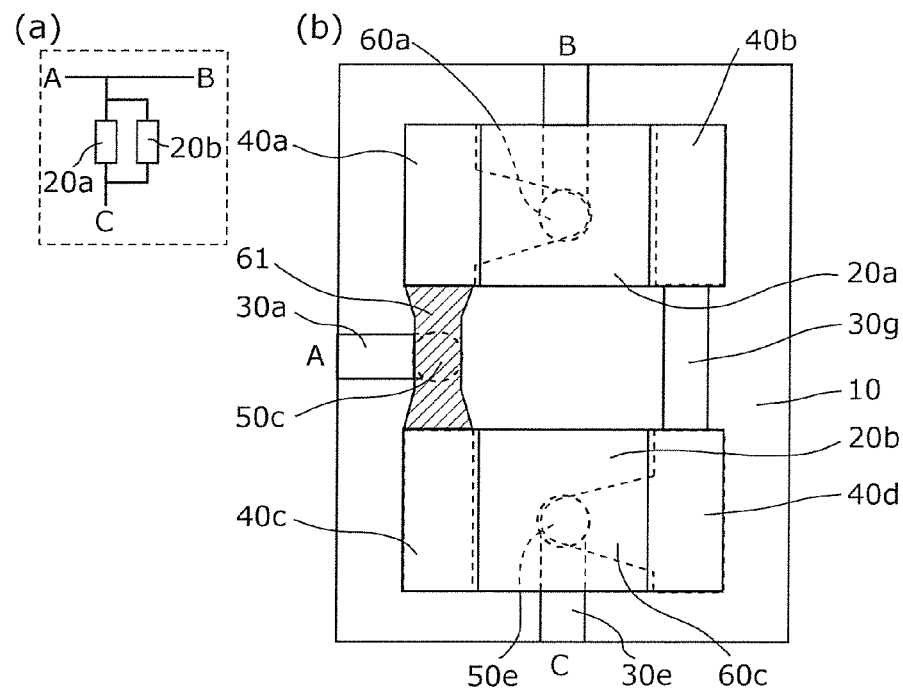
FIG. 7D is a plan view illustrating an example of configuration of the module component according to Preferred Embodiment 5 of the present invention in which the first mount component and the second mount component are mounted.

As illustrated in (a) of FIG. 7D, the module component according to the present preferred embodiment may further have a circuit configuration in which the first mount component 20*a* and the second mount component 20*b* connected in parallel to each other are connected between the terminal A and the terminal B so as to be branched from the wiring that interconnects the terminal A and the terminal B. In other words, the first mount component 20*a* and the second mount component 20*b* are connected in parallel to each other and are connected between the wiring 30*a* and the wiring 30*b* so as to be branched from the wiring that interconnects the wiring 30*a* and the wiring 30*b*.

As illustrated in (b) of FIG. 7D, in the module component according to the present preferred embodiment, the sub-electrode 50*c* is connected to the first main electrode 40*a* and the third main electrode 40*c* by the solder 61 without using a wiring pattern. The solder 61 used here is integral with the solder 60 (not illustrated) that is used to connect the electrode portion of the first mount component 20*a* to the first main electrode 40*a*, and with the solder 60 (not illustrated) that is used to connect the electrode portion of the second mount component 20*b* to the third main electrode 40*c*.

Furthermore, the sub-electrode 50*f* is connected to the first main electrode 40*a* by the solder 60*a* without using a wiring pattern. The solder 60*a* used here is integral with the solder 60 (not illustrated) that is used to connect the electrode portion of the first mount component 20*a* to the first main electrode 40*a*.

The sub-electrode 50*e* is connected to the fourth main electrode 40*d* by the solder 60*c* without using a wiring pattern. The solder 60*c* used here is integral with the solder 60 (not illustrated) that is used to connect the electrode portion of the second mount component 20*b* to the fourth main electrode 40*d*.

With the above-described connections, the first mount component 20*a* and the second mount component 20*b* are connected in parallel to each other and are connected between the terminal A and the terminal B so as to be branched from the wiring that interconnects the terminal A and the terminal B.

Figure 7E:
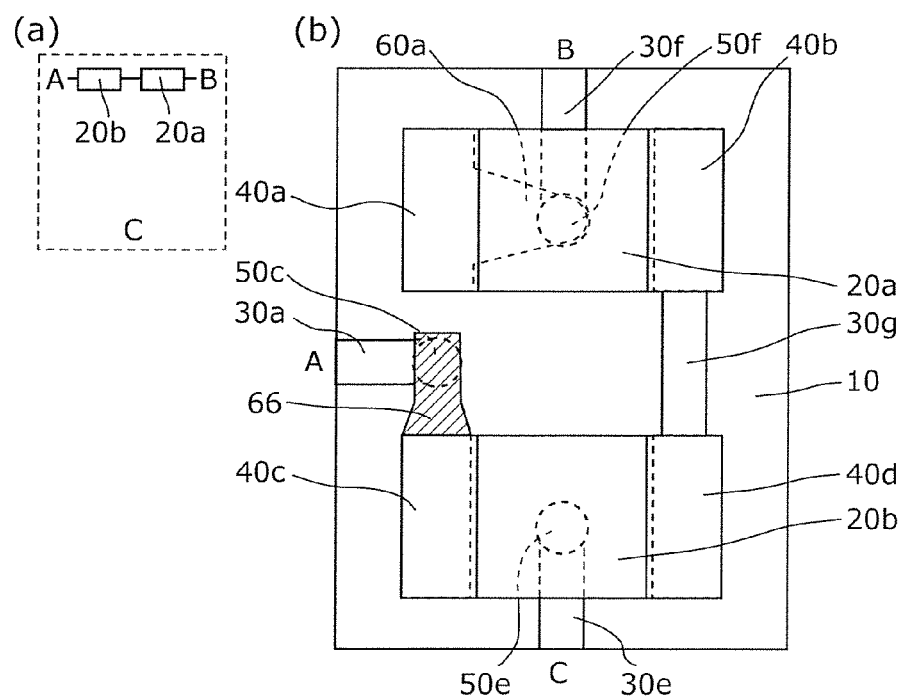
FIG. 7E is a plan view illustrating an example of a configuration of the module component according to Preferred Embodiment 5 of the present invention in which the first mount component and the second mount component are mounted.

As illustrated in (a) of FIG. 7E, the module component according to the present preferred embodiment may further have a circuit configuration in which the first mount component 20*a* and the second mount component 20*b* connected in series are connected in series between the terminal A and the terminal B. In other words, the first mount component 20*a* and the second mount component 20*b* are connected in series to each other and are connected in series between the wiring 30*a* and the wiring 30*b*.

As illustrated in (b) of FIG. 7E, in the module component according to the present preferred embodiment, the sub-electrode 50c is connected to the third main electrode 40c by the solder 66. The solder 66 used here is integral with the solder 60 (not illustrated) that is used to connect the electrode portion of the second mount component 20b to the third main electrode 40c.

Furthermore, the sub-electrode 50f is connected to the first main electrode 40a by the solder 60a without using a wiring pattern. The solder 60a used here is integral with the solder 60 (not illustrated) that is used to connect the electrode portion of the first mount component 20a to the first main electrode 40a.

The sub-electrode 50e is not connected to any of the electrode portions of the first mount component 20a and the second mount component 20b.

With the above-described connections, the first mount component 20a and the second mount component 20b are connected in series to each other and are connected in series between the terminal A and the terminal B.

As described above, some connection between the main electrodes may be previously established using a wiring without being limited to connection via a sub-electrode. By previously establishing the connection using the wiring, a connection state is able to be stabilized in a portion in which the circuit configuration is not changed.

While, in the above-described preferred embodiment, the second main electrode 40b and the fourth main electrode 40d are directly connected by the previously provided wiring pattern, other main electrodes may be directly connected by a previously provided wiring pattern without being limited to the second main electrode 40b and the fourth main electrode 40d.

Preferred Embodiment 6

Preferred Embodiment 6 of the present invention will be described below with reference to FIGS. 8A to 8C.

Figure 8A:
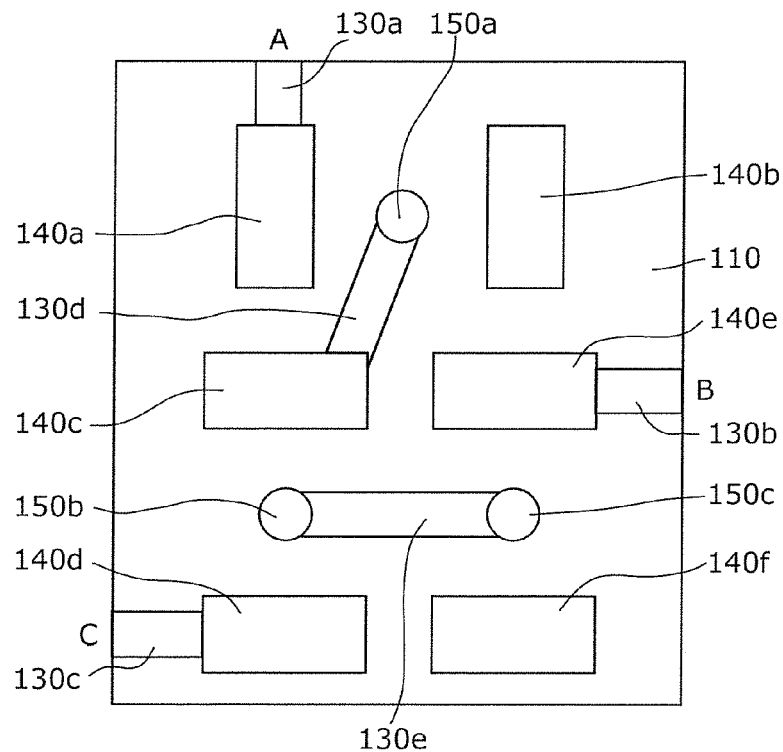
FIG. 8A is a plan view illustrating one example of an electrode pattern in a module component according to Preferred Embodiment 6 of the present invention.

FIG. 8A is a plan view illustrating one example of an electrode pattern in a module component according to the present preferred embodiment. FIGS. 8B and 8C are each a plan view illustrating an example of a configuration of the module component according to the present preferred embodiment in which a first mount component, a second mount component, and a third mount component are mounted.

The module component according to the present preferred embodiment is different from the module component 1 according to Preferred Embodiment 1 in that the module component according to the present preferred embodiment includes three mount components, and the circuit configuration is changed by changing a combination of the main electrode and the sub-electrode to be connected and a position at which solder is to be applied.

As illustrated in FIG. 8A, in addition to a first main electrode 140a, a second main electrode 140b, a third main electrode 140c, and a fourth main electrode 140d, a fifth main electrode 140e, and a sixth main electrode 140f are provided on or in the principal surface of a substrate 110. The first main electrode 140a and the second main electrode 140b are opposed to each other. The third main electrode 140c and the fourth main electrode 140d are opposed to each other. The fifth main electrode 140e and the sixth main electrode 140f are opposed to each other. The fifth main electrode 140e is provided at a position other than the positions at which the first main electrode 140a, the second main electrode 140b, the third main electrode 140c, and the fourth main electrode 140d are provided. The sixth main electrode 140f is provided at a position other than the positions at which the first main electrode 140a, the second main electrode 140b, the third main electrode 140c, the fourth main electrode 140d, and the fifth main electrode 140e are provided.

The third main electrode 140c is disposed near the first main electrode 140a. Long sides of the third main electrode 140c are opposed to short sides of the first main electrode 140a. Similarly, the fifth main electrode 140e is disposed near the second main electrode 140b. Long sides of the fourth main electrode 140d are opposed to short sides of the second main electrode 140b.

A sub-electrode 150a is provided between the first main electrode 140a and the second main electrode 140b. A sub-electrode 150b is provided between the third main electrode 140c and the fourth main electrode 140d. A sub-electrode 150c is provided between the fifth main electrode 140e and the second main electrode 140b.

The first main electrode 140a is connected to a wiring 130a that is an input wiring. The fifth main electrode 140e is connected to a wiring 130b that is an output wiring. The fourth main electrode 140d is connected to a wiring 130c that is connected to the ground.

Furthermore, the third main electrode 140c is connected to the sub-electrode 150a by a previously provided wiring 130d. The sub-electrode 150b and the sub-electrode 150c are connected by a previously provided wiring 130e.

Figure 8B:
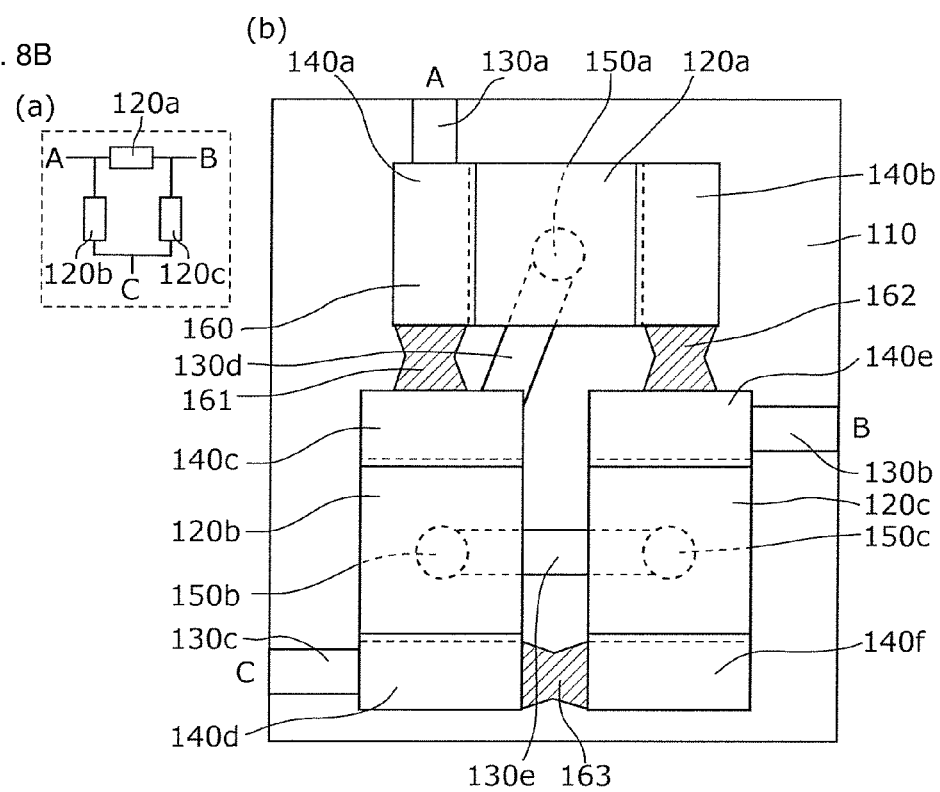
FIG. 8B is a plan view illustrating an example of a configuration of the module component according to Preferred Embodiment 6 of the present invention in which a first mount component, a second mount component, and a third mount component are mounted.

Here, as illustrated in (a) of FIG. 8B, the module component according to the present preferred embodiment may have a configuration in which a first mount component 120a, a second mount component 120b, and a third mount component 120c are connected in the A defined between the terminal A and the terminal B. In other words, the first mount component 120a is connected in series between the terminal A and the terminal B. The second mount component 120b is connected so as to be branched from a wiring that interconnects the terminal A and the first mount component 120a. The third mount component 120c is connected so as to be branched from a wiring that interconnects the first mount component 120a and the terminal B. The second mount component 120b and the third mount component 120c are connected in parallel to each other.

As illustrated in (b) of FIG. 8B, in the module component according to the present preferred embodiment, electrode portions at both ends of the first mount component 120a are connected respectively to the first main electrode 140a and the second main electrode 140b by the solder 160. Electrode portions at both ends of the second mount component 120b are connected respectively to the third main electrode 140c and the fourth main electrode 140d by the solder 160 (not illustrated). Electrode portions at both ends of the third mount component 120c are connected respectively to the fifth main electrode 140e and the sixth main electrode 140f by the solders 160 (not illustrated).

Furthermore, the electrode portion of the first mount component 120a, which is connected to the first main electrode 140a, and the electrode portion of the second mount component 120b, which is connected to the third main electrode 140c, are connected by the solder 161 without using a wiring pattern. The solder 161 used here is integral with the solder 160 that is used to connect the electrode portion of the first mount component 120a to the first main electrode 140a, and with the solder 160 (not illustrated) that is used to connect the electrode portion of the second mount component 120b to the third main electrode 140c.

The electrode portion of the first mount component 120*a*, which is connected to the second main electrode 140*b*, and the electrode portion of the third mount component 120*c*, which is connected to the fifth main electrode 140*e*, are connected by the solder 162 without using a wiring pattern. The solder 162 used here is integral with the solder 160 (not illustrated) that is used to connect the electrode portion of the first mount component 120*a* to the second main electrode 140*b*, and with the solder 60 (not illustrated) that is used to connect the electrode portion of the third mount component 120*c* to the fifth main electrode 140*e*.

The electrode portion of the second mount component 120*b*, which is connected to the fourth main electrode 140*d*, and the electrode portion of the third mount component 120*c*, which is connected to the sixth main electrode 140*f*, are connected by the solder 163 without using a wiring pattern. The solder 163 used here is integral with the solder 160 (not illustrated) that is used to connect the electrode portion of the first mount component 120*a* to the second main electrode 140*b*, and with the solder 160 (not illustrated) that is used to connect the electrode portion of the third mount component 120*c* to the fifth main electrode 140*e*.

The sub-electrode 150*b* and the sub-electrode 150*c* are not connected to any of the mount components. The sub-electrode 150*a* is connected to the third main electrode 140*c* via the wiring 130*d*, but it is not connected to the first mount component 120*a*.

With the above-described connections, the first mount component 120*a*, the second mount component 120*b*, and the third mount component 120*c* are connected in the A configuration between the terminal A and the terminal B.

Figure 8C:
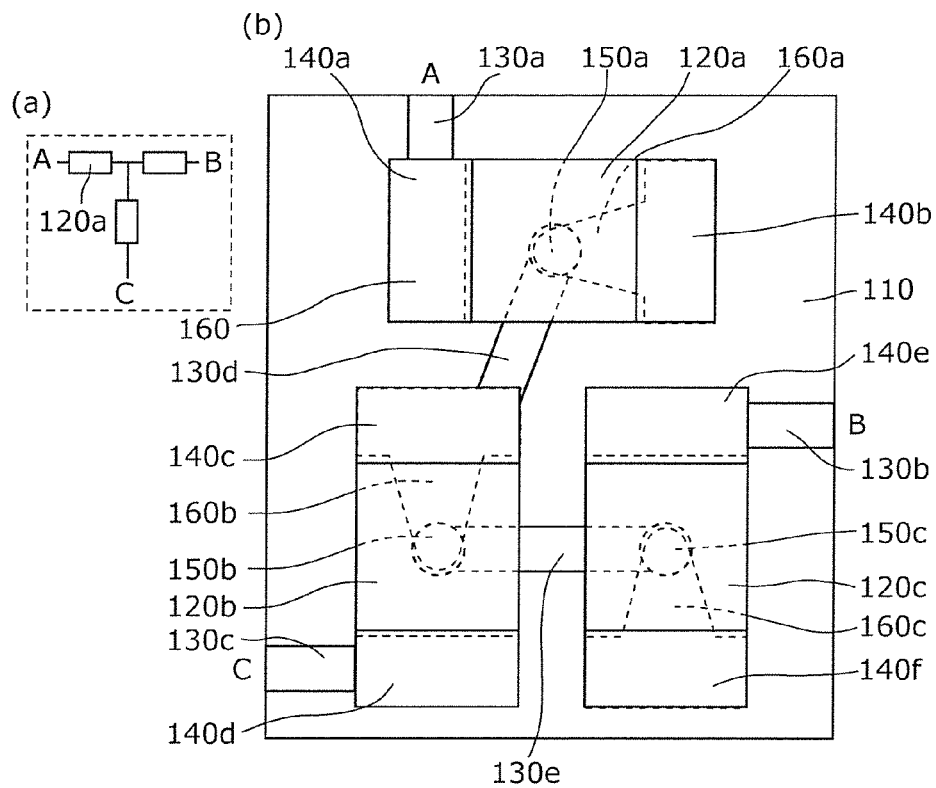
FIG. 8C is a plan view illustrating an example of a configuration of the module component according to Preferred Embodiment 6 of the present invention in which the first mount component, the second mount component, and the third mount component are mounted.

As illustrated in (a) of FIG. 8C, the module component according to the present preferred embodiment may further have a circuit configuration in which the first mount component 120*a*, the second mount component 120*b*, and the third mount component 120*c* are connected in the Y configuration between the terminal A and the terminal B. In other words, the first mount component 120*a* and the second mount component 120*b* are connected in series between the terminal A and the terminal B, and the third mount component 120*c* is connected between the first mount component 120*a* and the second mount component 120*b* so as to be branched from the wiring that interconnects the terminal A and the terminal B.

As illustrated in (b) of FIG. 8C, in the module component according to the present preferred embodiment, the electrode portions at both the ends of the first mount component 120*a* are connected respectively to the first main electrode 140*a* and the second main electrode 140*b* by the solder 160. The electrode portions at both the ends of the second mount component 120*b* are connected respectively to the third main electrode 140*c* and the fourth main electrode 140*d* by the solder 160 (not illustrated). The electrode portions at both the ends of the third mount component 120*c* are connected respectively to the fifth main electrode 140*e* and the sixth main electrode 140*f* by the solder 160 (not illustrated).

Furthermore, the sub-electrode 150*a* and the second main electrode 140*b* are connected by the solder 160*a* without using a wiring pattern. The solder 160*a* used here is integral with the solder 160 (not illustrated) that is used to connect the electrode portion of the first mount component 120*a* to the second main electrode 140*b*. Similarly, the sub-electrode 150*b* and the third main electrode 140*c* are connected by the solder 160*b* without using a wiring pattern. The solder 160*b* used here is integral with the solder 160 (not illustrated) that is used to connect the second mount component 120*b* to the third main electrode 140*c*. Moreover, the sub-electrode 150*c* and the sixth main electrode 140*f* are connected by the solder 160*c* without using a wiring pattern. The solder 160*c* used here is integral with the solder 160 (not illustrated) that is used to connect the third mount component 120*c* to the sixth main electrode 140*f*.

With the above-described connections, the first mount component 120*a*, the second mount component 120*b*, and the third mount component 120*c* are connected in the Y configuration between the terminal A (e.g., the input terminal) and the terminal B (e.g., the output terminal).

While the above preferred embodiment has been described in connection with the configuration including three mount components, the number of mount components may be increased without being limited to three. The combination of the main electrode and the sub-electrode to be connected may be modified as appropriate.

Preferred Embodiment 7

Preferred Embodiment 7 of the present invention will be described below with reference to FIGS. 9A to 9C.

Figure 9A:
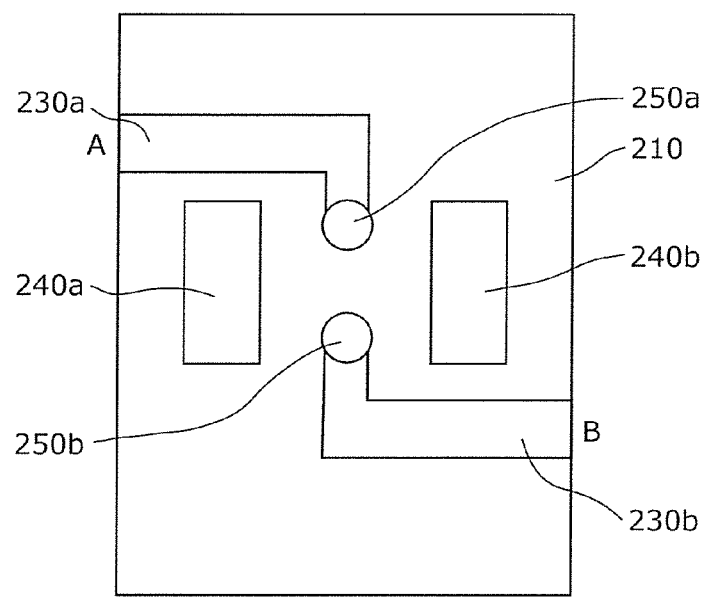
FIG. 9A is a plan view illustrating one example of an electrode pattern in a module component according to Preferred Embodiment 7 of the present invention.

FIG. 9A is a plan view illustrating one example of an electrode pattern in a module component according to the present preferred embodiment. FIGS. 9B and 9C are each a plan view illustrating an example of a configuration of the module component according to the present preferred embodiment in which a first mount component is mounted.

The module component 1 according to the present preferred embodiment is different from the module component 1 according to Preferred Embodiment 1 in that the module component 1 according to the present preferred embodiment includes one mount component and two sub-electrodes, and that input and output directions with respect to the mount component are changed by changing positions of the solder with the aid of the sub-electrodes, which are connected to main electrodes, without changing an orientation in which the mount component is mounted. Thus, when the mount component is, for example, an inductor having polarities, the direction of a current flowing through the mount component is able to be changed without changing the mounting orientation of the mount component. More specifically, when the mount component is an inductor, for example, it is theoretically possible to change the direction of a current flowing through the mount component by changing the mounting orientation of the mount component. However, if the mounting orientation of the inductor is changed, the direction of a magnetic field generated from the inductor is also changed. Therefore, other mount components disposed around the inductor are affected by the relevant mount component, i.e., the inductor, of which mounting orientation has been changed. On the other hand, in the present preferred embodiment, the direction of the current flowing through the mount component is able to be changed without changing the mounting orientation of the mount component. As a result, influences of the mounting orientation and the current direction of the mount component upon the other surrounding components are reduced, and a degree of design freedom is increased.

As illustrated in FIG. 9A, a first main electrode 240*a* and a second main electrode 240*b* are opposed to each other on or in a substrate 210. A sub-electrode 250*a* and a sub-electrode 250*b* are provided between the first main electrode 240*a* and the second main electrode 240*b*. The sub-electrode 250a is connected to a wiring 230a that is an input wiring. The sub-electrode 250b is connected to a wiring 230b that is an output wiring.

Figure 9B:
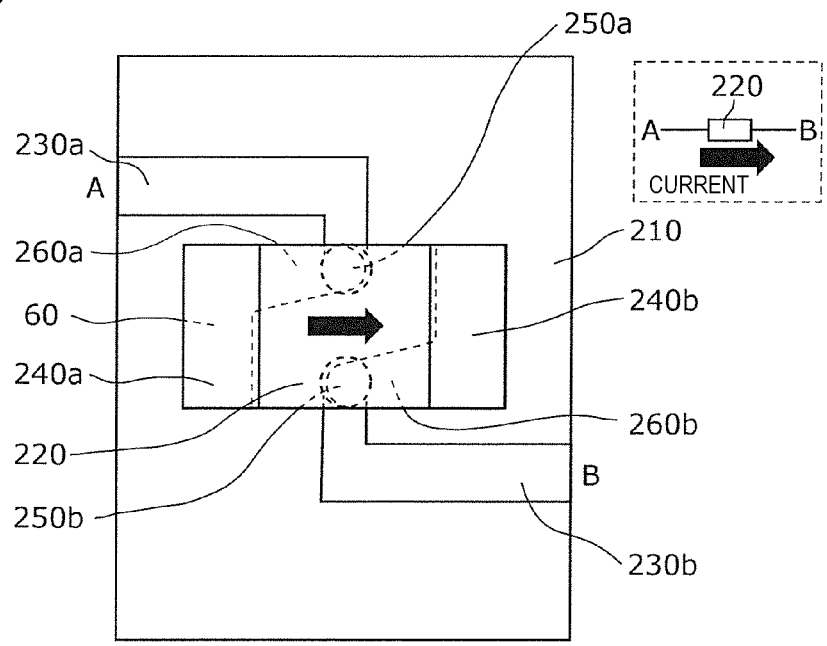
FIG. 9B is a plan view illustrating an example of a configuration of the module component according to Preferred Embodiment 7 of the present invention in which a first mount component is mounted.
Figure 9C:
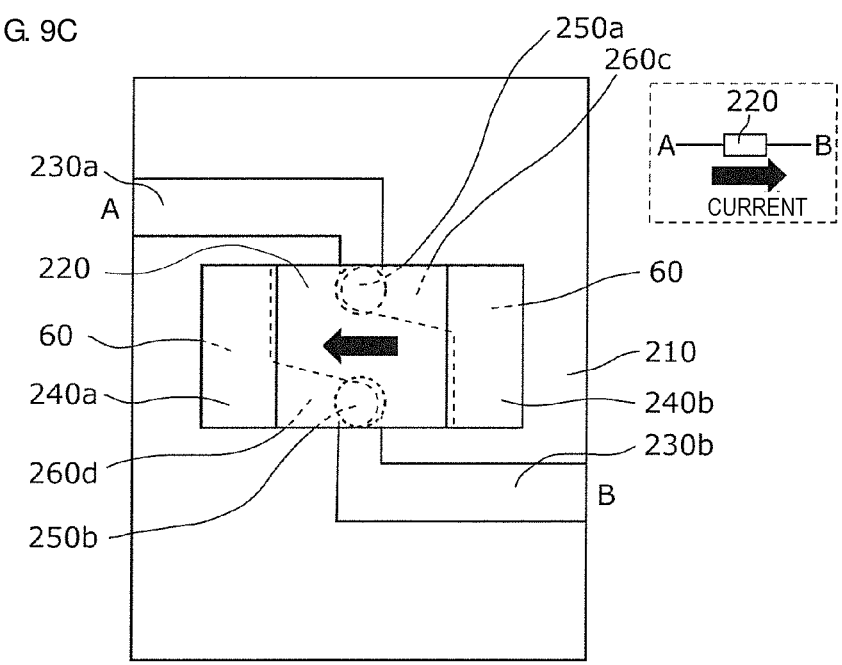
FIG. 9C is a plan view illustrating an example of a configuration of the module component according to Preferred Embodiment 7 of the present invention in which the first mount component is mounted.

Here, as illustrated in FIG. 9B, electrode portions at both ends of a first mount component 220 are connected respectively to the first main electrode 240a and the second main electrode 240b. The first mount component 220 is preferably, for example, an inductor having polarities.

Furthermore, the sub-electrode 250a and the first main electrode 240a are connected by the solder 260a without using a wiring pattern. The solder 260a used here is integral with the solder 60 (not illustrated) that is used to connect the electrode portion of the first mount component 220 to the first main electrode 240a. Similarly, the sub-electrode 250b and the second main electrode 240b are connected by the solder 260b without using a wiring pattern, etc. The solder 260b used here is integral with the solder 60 (not illustrated) that is used to connect the electrode portion of the first mount component 220 to the second main electrode 240b.

Thus, in the first mount component 220, a current flows in a direction toward the electrode portion connected to the second main electrode 240b from the electrode portion connected the first main electrode 240a.

In the case of reversing the direction of the current flowing through the first mount component 220, it is only required to reverse the connections of the sub-electrodes 250a and 250b with respect to the first main electrode 240a and the second main electrode 240b. More specifically, as illustrated in FIG. 9C, the sub-electrode 250a and the second main electrode 240b are connected by the solder 260c without using a wiring pattern, and the sub-electrode 250b and the first main electrode 240a are connected by the solder 260d without using a wiring pattern.

As a result, in the first mount component 220, a current is able to be caused to flow in a direction toward the first main electrode 240a from the second main electrode 240b.

Preferred Embodiment 8

Preferred Embodiment 8 of the present invention will be described below with reference to FIGS. 10A to 10C.

Figure 10A:
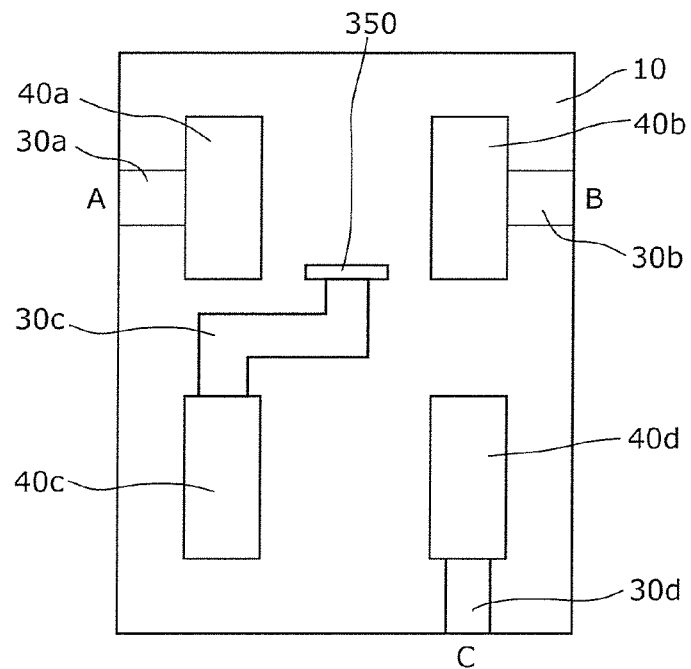
FIG. 10A is a plan view illustrating one example of an electrode pattern in a module component according to Preferred Embodiment 8 of the present invention.

FIG. 10A is a plan view illustrating one example of an electrode pattern in a module component according to the present preferred embodiment. FIGS. 10B and 10C are each a plan view illustrating an example of a configuration of the module component according to the present preferred embodiment in which a first mount component and a second mount component are mounted.

The module component according to the present preferred embodiment is different from the module component 1 according to Preferred Embodiment 1 in that a sub-electrode overlaps with the first mount component and is positioned along a lateral surface of the first mount component when viewing the module component according to the present preferred embodiment in plan. The remaining configuration is the same as or similar to that in Preferred Embodiment 1, and thus detailed description of the remaining configuration is omitted.

As illustrated in FIG. 10A, a sub-electrode 350 is provided between the first main electrode 40a and the second main electrode 40b on or in the principal surface of the substrate 10. The sub-electrode 350 is positioned along a long-side lateral surface of the first mount component 20a and overlapped with the first mount component in a plan view when the electrode portions at both the ends of the first mount component 20a are connected respectively to the first main electrode 40a and the second main electrode 40b. The sub-electrode 350 preferably has, for example, a rectangular or substantially rectangular shape having a long side of about 90 m and a short side of about 10 μm.

Figure 10B:
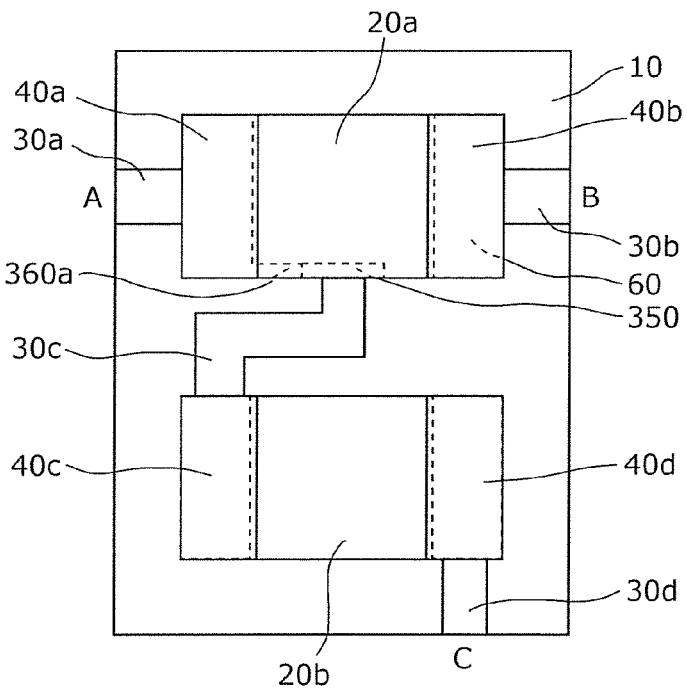
FIG. 10B is a plan view illustrating an example of a configuration of the module component according to Preferred Embodiment 8 of the present invention in which a first mount component and a second mount component are mounted.

As illustrated in FIG. 10B, the electrode portions at both the ends of the first mount component 20a are connected respectively to the first main electrode 40a and the second main electrode 40b by the solder 60 (not illustrated). The sub-electrode 350 and the first main electrode 40a are connected by the solder 360a without using a wiring pattern. The solder 360a used here is integral with the solder 60 (not illustrated) that is used to connect the electrode portion of the first mount component 20a to the first main electrode 40a.

Figure 10C:
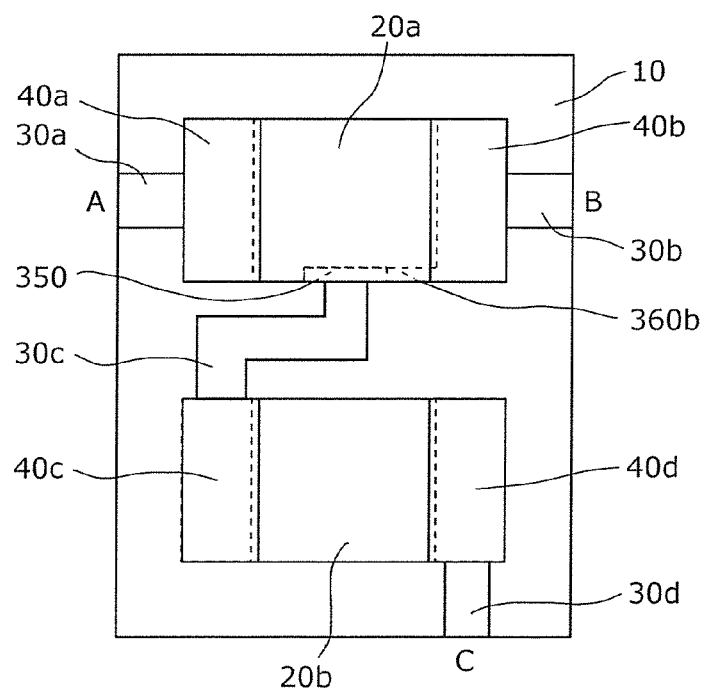
FIG. 10C is a plan view illustrating an example of a configuration of the module component according to Preferred Embodiment 8 of the present invention in which the first mount component and the second mount component are mounted.

As illustrated in FIG. 10C, the sub-electrode 350 may be connected to the second main electrode 40b by the solder 360b without using a wiring pattern. The solder 360b used here is integral with the solder 60 (not illustrated) that is used to connect the electrode portion of the first mount component 20a to the first main electrode 40a.

Since the sub-electrode 350 is provided at the position along the long-side lateral surface of the first mount component 20a, the sub-electrode 350 does not impede magnetic force lines directed toward a region under the first mount component 20a. Therefore, characteristics of the module component according to the present preferred embodiment are improved.

In Preferred Embodiment 1 described above, the first mount component 20a and the second mount component 20b are disposed side by side in a short-side direction such that a long-side direction of the first mount component 20a and a long-side direction of the second mount component 20b are parallel or substantially parallel to each other. However, the first mount component 20a and the second mount component 20b may be disposed side by side in the long-side direction such that the short-side direction of the first mount component 20a and the short-side direction of the second mount component 20b are parallel or substantially parallel to each other. Alternatively, the first mount component 20a and the second mount component 20b may be disposed such that the long-side direction of the first mount component 20a and the short-side direction of the second mount component 20b are parallel or substantially parallel to each other. Modifications of the above-described preferred embodiments are as follows.

Modification 1

Modification 1 of a preferred embodiment of the present invention will be described below.

Figure 11A:
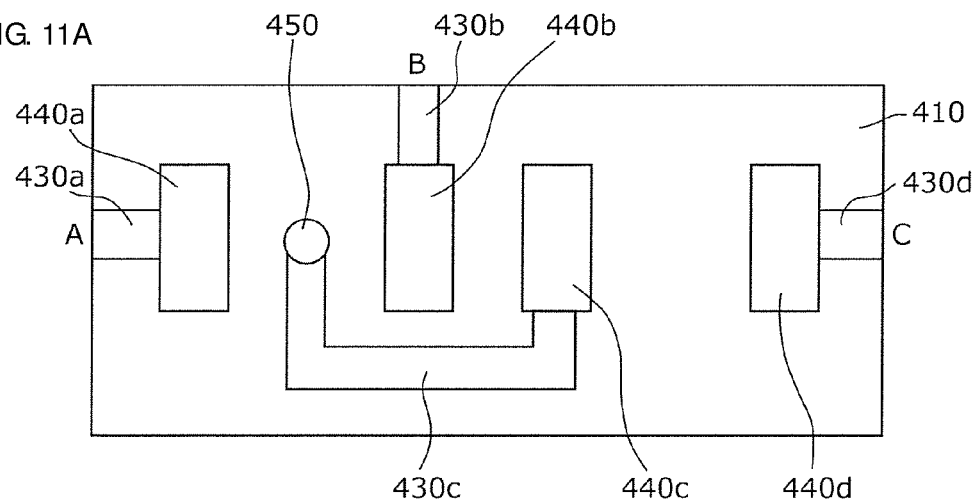
FIG. 11A is a plan view illustrating one example of an electrode pattern in a module component according to Modification 1 of a preferred embodiment of the present invention.
Figure 11B:
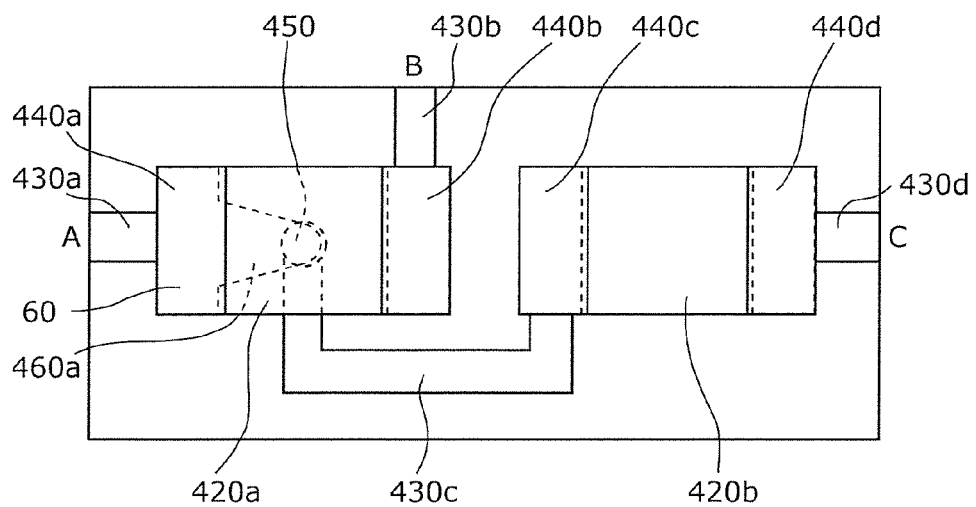
FIG. 11B is a plan view illustrating an example of a configuration of the module component according to Modification 1 in which a first mount component and a second mount component are mounted.

FIG. 11A is a plan view illustrating one example of an electrode pattern in a module component according to the present modification. FIG. 11B is a plan view illustrating an example of a configuration of the module component according to the present modification in which a first mount component and a second mount component are mounted.

As illustrated in FIG. 11A, a substrate 410 includes a first main electrode 440a, a second main electrode 440b, a third main electrode 440c, and a fourth main electrode 440d. The first main electrode 440a and the second main electrode 440b are opposed to each other such that their long sides are parallel or substantially parallel. Similarly, the third main electrode 440c and the fourth main electrode 440d are opposed to each other such that their long sides are parallel or substantially parallel. The second main electrode 440b and the third main electrode 440c are opposed to each other such that their long sides are parallel or substantially parallel.

A sub-electrode 450 is provided between the first main electrode 440a and the second main electrode 440b. The sub-electrode 450 is connected to the third main electrode 440c by a wiring 430c. The first main electrode 440a is connected to a wiring 430a that is an input wiring. The second main electrode is connected to a wiring 430b that is an output wiring. The fourth main electrode 440d is connected to a wiring 430d that is connected to the ground.

As illustrated in FIG. 11B, the sub-electrode 450 is connected to the first main electrode 440a by the solder 460a without using a wiring pattern. The solder 460a used here is integral with the solder 60 (not illustrated) that is used to connect an electrode portion of the first mount component 420a to the first main electrode 440a.

Electrode portions at both ends of the first mount component 420a are connected respectively to the first main electrode 440a and the second main electrode 440b by solder. Similarly, electrode portions at both ends of the second mount component 420b are connected respectively to the third main electrode 440c and the fourth main electrode 440d by solder. With such a configuration, even when two mount components, i.e., the first mount component 420a and the second mount component 420b, are disposed side by side in the long-side direction, a circuit configuration similar to the circuit illustrated in FIG. 3A is able to be achieved.

Although not illustrated, the sub-electrode 450 may be connected to the second main electrode 440b by solder without using a wiring pattern. With such a configuration, a circuit configuration similar to the circuit illustrated in FIG. 3B is also able to be achieved.

Modification 2

Modification 2 of a preferred embodiment of the present invention will be described below.

Figure 12A:
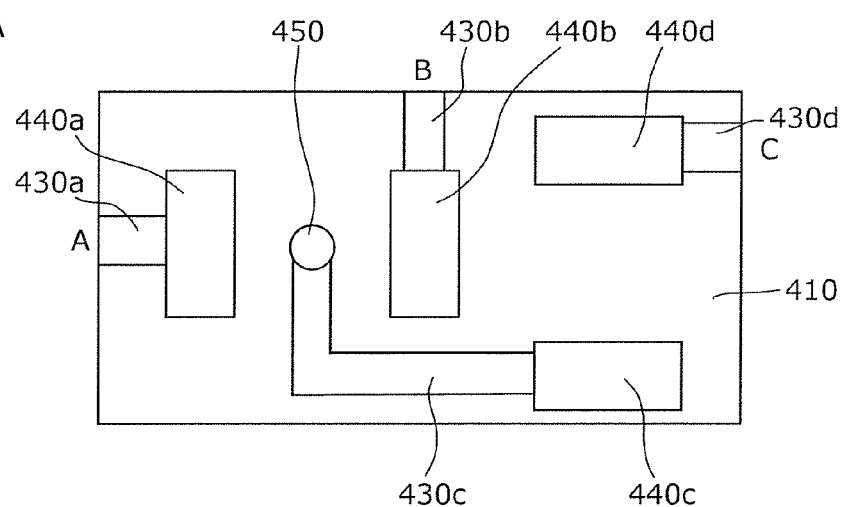
FIG. 12A is a plan view illustrating one example of an electrode pattern in a module component according to Modification 2 of a preferred embodiment of the present invention.
Figure 12B:
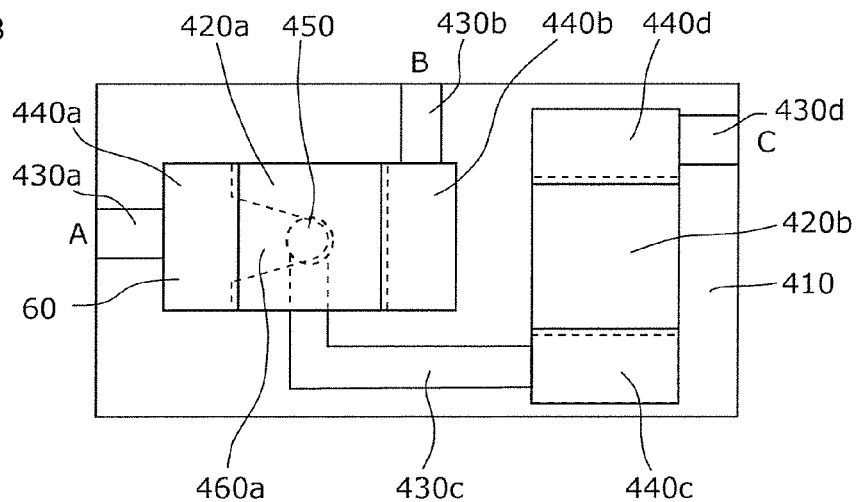
FIG. 12B is a plan view illustrating an example of a configuration of the module component according to Modification 2 in which a first mount component and a second mount component are mounted.

FIG. 12A is a plan view illustrating one example of an electrode pattern in a module component according to the present modification. FIG. 12B is a plan view illustrating an example of a configuration of a module component according to the present modification in which a first mount component and a second mount component are mounted.

As illustrated in FIG. 12A, the substrate 410 includes the first main electrode 440a, the second main electrode 440b, the third main electrode 440c, and the fourth main electrode 440d. The first main electrode 440a and the second main electrode 440b are opposed to each other such that their long sides are parallel or substantially parallel. Similarly, the third main electrode 440c and the fourth main electrode 440d are opposed to each other such that their long sides are parallel or substantially parallel.

The second main electrode 440b and the third main electrode 440c are disposed such that the long sides of the second main electrode 440b are parallel or substantially parallel to short sides of the third main electrode 440c. Moreover, the second main electrode 440b and the fourth main electrode 440d are disposed such that the long sides of the second main electrode 440b are parallel or substantially parallel to short sides of the fourth main electrode 440d.

As in Modification 1, the sub-electrode 450 is disposed between the first main electrode 440a and the second main electrode 440b. The sub-electrode 450 is connected to the third main electrode 440c by the wiring 430c. The first main electrode 440a is connected to the wiring 430a that is the input wiring. The second main electrode 440b is connected to the wiring 430b that is the output wiring. The fourth main electrode 440d is connected to the wiring 430d that is connected to the ground.

As in the module component described in Modification 1, the sub-electrode 450 is connected to the first main electrode 440a by the solder 460a without using a wiring pattern, as illustrated in FIG. 12B. With such a configuration, even when two mount components, i.e., the first mount component 420a and the second mount component 420b, are disposed in a crossing relationship, a circuit configuration similar to the circuit illustrated in FIG. 3A is able to be achieved.

Although not illustrated, the sub-electrode 450 may be connected to the second main electrode 440b by solder without using a wiring pattern. With such a configuration, a circuit configuration similar to the circuit illustrated in FIG. 3B is able to be achieved.

The present invention is not limited to the configurations described in the preferred embodiments and modifications thereof, and the present invention may be appropriately modified as represented by the following exemplary modifications.

For instance, while the above-described preferred embodiments have been described in connection with the case of including one, two or three mount components, the number of mount components may be changed without being limited to those values.

While, in the above-described preferred embodiments, the solder preferably is used as the conductive bonding member, for example, the conductive bonding member is not limited to the solder, and it may be made of another material. Furthermore, a method of applying the solder is not limited to the above-described methods, and another method may also be used.

The sub-electrode may be disposed under any of the mount components when viewing the module components in plan. As an alternative, the sub-electrode may be provided on or in the principal surface of the substrate between two main electrodes at a position outside regions under the mount components.

The number of sub-electrode(s) to be provided under the mount component is not limited to one, and a plurality of sub-electrodes may be provided.

The wirings provided on or in the principal surface of the substrate are not limited to linear wirings, and they may have curved shapes, for example.

The sizes and the shapes of the main electrodes, the sub-electrodes, and the wirings are not limited to those described in the above-described preferred embodiments, and they may be changed as appropriate.

The present invention further includes not only preferred embodiments obtained by modifying the above-described preferred embodiments and modifications thereof based on ideas conceivable by those skilled in the art, but also preferred embodiments implemented by optionally combining the elements and the functions in the above-described preferred embodiments and modifications within a scope not departing away from the gist of the present invention.

Preferred embodiments of the present invention may be applied to electrical devices, communication devices, and other suitable devices, each including a module component that includes a mount component mounted to a circuit substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A module component comprising:
a substrate;
a first main electrode on or in a principal surface of the substrate;

a second main electrode on or in the principal surface and opposed to the first main electrode;

a third main electrode on or in the principal surface at a position other than positions at which the first main electrode and the second main electrode are disposed;

a fourth main electrode on or in the principal surface and opposed to the third main electrode;

a sub-electrode between two of the first main electrode, the second main electrode, the third main electrode, and the fourth main electrode, and connected to one of the first main electrode, the second main electrode, the third main electrode, and the fourth main electrode by a conductive bonding member;

a first mount component including first electrode portions connected to the first main electrode and the second main electrode; and a second mount component including second electrode portions connected to the third main electrode and the fourth main electrode; wherein an area of the sub-electrode is smaller than an area of each of the first main electrode, the second main electrode, the third main electrode, and the fourth main electrode; and the sub-electrode is spaced apart from each of the first electrode portions of the first mount component and the second electrode portions of the second mount component when viewing the module component in plan.

2. The module component according to claim 1, wherein the sub-electrode is disposed at least at one of positions between the first main electrode and the second main electrode and between the third main electrode and the fourth main electrode.

3. The module component according to claim 1, wherein the sub-electrode is disposed at least at one of positions between the first main electrode and one of the third main electrode and the fourth main electrode closer to the first main electrode, and between the second main electrode and one of the third main electrode and the fourth main electrode closer to the second main electrode.

4. The module component according to claim 3, wherein at least one pair of main electrodes between a pair of the first main electrode and one of the third main electrode and the fourth main electrode closer to the first main electrode, and a pair of the second main electrode and one of the third main electrode and the fourth main electrode closer to the second main electrode are connected via the sub-electrode.

5. The module component according to claim 4, wherein the sub-electrode is connected to the first mount component or the second mount component via at least one of the first main electrode, the second main electrode, the third main electrode, and the fourth main electrode.

6. The module component according to claim 1, wherein the sub-electrode is grounded.

7. The module component according to claim 1, wherein one of the first main electrode, the second main electrode, the third main electrode, and the fourth main electrode is connected to an input wiring.

8. The module component according to claim 1, wherein one of the first main electrode, the second main electrode, the third main electrode, and the fourth main electrode is connected to an output wiring.

9. The module component according to claim 7, wherein the sub-electrode is connected to the one of the first main electrode, the second main electrode, the third main electrode, and the fourth main electrode connected to the input wiring.

10. The module component according to claim 8, wherein the sub-electrode is connected to the one of the first main electrode, the second main electrode, the third main electrode, and the fourth main electrode connected to the output wiring.

11. The module component according to claim 2, wherein a plurality of the sub-electrodes are disposed at least at one of positions between the first main electrode and the second main electrode and between the third main electrode and the fourth main electrode.

12. The module component according to claim 1, wherein the sub-electrode overlaps with the first mount component or the second mount component and is positioned along a lateral surface of the first mount component or the second mount component when viewing the module component in plan.

13. The module component according to claim 7, wherein
one of the first main electrode, the second main electrode, the third main electrode, and the fourth main electrode, excluding the one of the first main electrode, the second main electrode, the third main electrode, and the fourth main electrode connected to the input wiring, is connected to the output wiring; and
the first mount component and the second mount component are connected in parallel to each other and are connected in series between the input wiring and the output wiring.

14. The module component according to claim 7, wherein
one of the first main electrode, the second main electrode, the third main electrode, and the fourth main electrode, excluding the one of the first main electrode, the second main electrode, the third main electrode, and the fourth main electrode connected to the input wiring, is connected to the output wiring; and
the first mount component and the second mount component are connected in series to each other and are connected between the input wiring and the output wiring so as to be branched from a wiring interconnecting the input wiring and the output wiring.

15. The module component according to claim 7, wherein
one of the first main electrode, the second main electrode, the third main electrode, and the fourth main electrode, excluding the one of the first main electrode, the second main electrode, the third main electrode, and the fourth main electrode connected to the input wiring, is connected to the output wiring; and
the first mount component and the second mount component are connected in parallel to each other and are connected between the input wiring and the output wiring so as to be branched from a wiring interconnecting the input wiring and the output wiring.

16. The module component according to claim 7, wherein
one of the first main electrode, the second main electrode, the third main electrode, and the fourth main electrode, excluding the one of the first main electrode, the second main electrode, the third main electrode, and the fourth main electrode connected to the input wiring, is connected to the output wiring; and
the first mount component and the second mount component are connected in series to each other and are connected in series between the input wiring and the output wiring.

17. The module component according to claim 8, further comprising:

a fifth main electrode at a position other than positions at which the first main electrode, the second main electrode, the third main electrode, and the fourth main electrode are provided;

a sixth main electrode opposing the fifth main electrode; and a third mount component mounted to the fifth main electrode and the sixth main electrode; wherein one of the first mount component, the second mount component, and the third mount component is connected in series between the input wiring and the output wiring;

another one of the first mount component, the second mount component, and the third mount component is connected between the input wiring and the one of the first mount component, the second mount component, and the third mount component connected in series to the input wiring so as to be branched from a wiring interconnecting the input wiring and the output wiring; and a remaining one of the first mount component, the second mount component, and the third mount component is connected between the one of the first mount component, the second mount component, and the third mount component connected in series to the output wiring, and the output wiring so as to be branched from the wiring interconnecting the input wiring and the output wiring.

18. The module component according to claim 8, further comprising:

a fifth main electrode at a position other than positions at which the first main electrode, the second main electrode, the third main electrode, and the fourth main electrode are provided;

a sixth main electrode at a position opposing the fifth main electrode; and a third mount component mounted to the fifth main electrode and the sixth main electrode; wherein two of the first mount component, the second mount component, and the third mount component are connected in series between the input wiring and the output wiring; and a remaining one of the first mount component, the second mount component, and the third mount component is connected between the first mount component and the second mount component so as to be branched from a wiring interconnecting the input wiring and the output wiring.

19. The module component according to claim 1, wherein the second main electrode or the fourth main electrode that is positioned closest to the first main electrode or the third main electrode is connected to the closest first main electrode or the closest third main electrode with the sub-electrode not interposed therebetween.

20. A module component comprising:

a substrate;

a first main electrode on or in a principal surface of the substrate;

a second main electrode on or in the principal surface and opposed to the first main electrode;

a first sub-electrode and a second sub-electrode on or in the principal surface between the first main electrode and the second main electrode; and a first mount component mounted to the first main electrode and the second main electrode; wherein an area of each of the first sub-electrode and the second sub-electrode is smaller than an area of each of the first main electrode and the second main electrode;

the first sub-electrode is connected by a conductive bonding member to the first main electrode or the second main electrode;

the second sub-electrode is connected by a conductive bonding member to the first main electrode or the second main electrode to which the first sub-electrode is not connected;

the first mount component includes electrode portions that are connected to the first main electrode and the second main electrode; and the first sub-electrode and the second sub-electrode are spaced apart from each of the electrode portions of the first mount component when viewing the module component in plan.

* * * * *